United States Patent
Yang et al.

(10) Patent No.: US 11,189,598 B2
(45) Date of Patent: Nov. 30, 2021

(54) SEMICONDUCTOR DEVICE AND METHOD OF FORMING EMBEDDED DIE SUBSTRATE, AND SYSTEM-IN-PACKAGE MODULES WITH THE SAME

(71) Applicant: STATS ChipPAC Pte. Ltd., Singapore (SG)

(72) Inventors: DeokKyung Yang, Incheon Si (KR); HunTeak Lee, Gyeongi-do (KR); SungSoo Kim, Seoul (KR); HeeSoo Lee, Kyunggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 67 days.

(21) Appl. No.: 16/570,165

(22) Filed: Sep. 13, 2019

(65) Prior Publication Data

US 2020/0006295 A1     Jan. 2, 2020

Related U.S. Application Data

(62) Division of application No. 15/706,584, filed on Sep. 15, 2017, now Pat. No. 10,468,384.

(51) Int. Cl.
*H01L 23/02*     (2006.01)
*H01L 25/065*     (2006.01)
(Continued)

(52) U.S. Cl.
CPC ........ *H01L 25/0657* (2013.01); *H01L 23/538* (2013.01); *H01L 23/552* (2013.01);
(Continued)

(58) Field of Classification Search
CPC ..... H01L 25/50; H01L 24/13; H01L 23/3114; H01L 23/5384; H01L 23/3121;
(Continued)

(56) References Cited

U.S. PATENT DOCUMENTS

| | | |
|---|---|---|
| 6,781,241 B2 | 8/2004 | Nishumura et al. |
| 8,106,499 B2 | 1/2012 | Camacho et al. |

(Continued)

FOREIGN PATENT DOCUMENTS

| | | |
|---|---|---|
| CN | 106067447 A | 11/2016 |
| JP | H04291984 A | 10/1992 |

(Continued)

*Primary Examiner* — Theresa T Doan
(74) *Attorney, Agent, or Firm* — Brian M. Kaufman; Robert D. Atkins; Patent Law Group: Atkins and Associates, P.C.

(57) ABSTRACT

A semiconductor device has a first substrate. A first semiconductor component is disposed on a first surface of the first substrate. A second substrate includes a vertical interconnect structure on a first surface of the second substrate. A second semiconductor component is disposed on the first surface of the second substrate. The first semiconductor component or second semiconductor component is a semiconductor package. The first substrate is disposed over the second substrate with the first semiconductor component and second semiconductor component between the first substrate and second substrate. A first encapsulant is deposited between the first substrate and second substrate. A SiP submodule is disposed over the first substrate or second substrate opposite the encapsulant. A shielding layer is formed over the SiP submodule.

25 Claims, 30 Drawing Sheets

(51) Int. Cl.

| | |
|---|---|
| *H01L 23/00* | (2006.01) |
| *H01L 25/00* | (2006.01) |
| *H01L 23/538* | (2006.01) |
| *H01L 25/16* | (2006.01) |
| *H01L 25/10* | (2006.01) |
| *H01L 23/552* | (2006.01) |
| *H01L 23/31* | (2006.01) |
| *H01L 21/56* | (2006.01) |

(52) U.S. Cl.
CPC .............. *H01L 24/11* (2013.01); *H01L 24/17* (2013.01); *H01L 25/0652* (2013.01); *H01L 25/105* (2013.01); *H01L 25/16* (2013.01); *H01L 25/50* (2013.01); *H01L 21/561* (2013.01); *H01L 23/3128* (2013.01); *H01L 24/05* (2013.01); *H01L 24/13* (2013.01); *H01L 24/16* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/1132* (2013.01); *H01L 2224/1134* (2013.01); *H01L 2224/11334* (2013.01); *H01L 2224/11462* (2013.01); *H01L 2224/11464* (2013.01); *H01L 2224/11849* (2013.01); *H01L 2224/16227* (2013.01); *H01L 2224/81191* (2013.01); *H01L 2224/94* (2013.01); *H01L 2224/97* (2013.01); *H01L 2225/06517* (2013.01); *H01L 2225/06572* (2013.01); *H01L 2225/1023* (2013.01); *H01L 2225/1041* (2013.01); *H01L 2225/1058* (2013.01); *H01L 2924/15311* (2013.01); *H01L 2924/19105* (2013.01); *H01L 2924/19106* (2013.01); *H01L 2924/3025* (2013.01)

(58) Field of Classification Search
CPC .............. H01L 23/5226; H01L 25/117; H01L 23/4951; H01L 23/538; H01L 24/10
USPC ........................................................ 257/686
See application file for complete search history.

(56) References Cited

U.S. PATENT DOCUMENTS

| | | | |
|---|---|---|---|
| 8,653,654 | B2 | 2/2014 | Chandra et al. |
| 9,252,130 | B2 | 2/2016 | Kim et al. |
| 9,527,723 | B2 | 12/2016 | Lin et al. |
| 2003/0090883 | A1 | 5/2003 | Asahi et al. |
| 2004/0160752 | A1* | 8/2004 | Yamashita ............. H05K 1/186 |
| | | | 361/766 |
| 2004/0178508 | A1 | 9/2004 | Nishimura et al. |
| 2009/0273094 | A1* | 11/2009 | Ha ........................ H01L 25/105 |
| | | | 257/777 |
| 2010/0142170 | A1* | 6/2010 | Kim ........................ H01L 24/82 |
| | | | 361/762 |
| 2011/0248389 | A1 | 10/2011 | Yorita et al. |
| 2011/0304015 | A1 | 12/2011 | Kim et al. |
| 2016/0315027 | A1 | 10/2016 | Ryu et al. |
| 2017/0040304 | A1 | 2/2017 | Shih et al. |

FOREIGN PATENT DOCUMENTS

| | | |
|---|---|---|
| JP | 2008294475 A | 12/2008 |
| JP | 2011198866 A | 10/2011 |
| KR | 20110135294 A | 12/2011 |
| KR | 20160045620 A | 4/2016 |
| WO | 2016007120 A1 | 1/2016 |

* cited by examiner

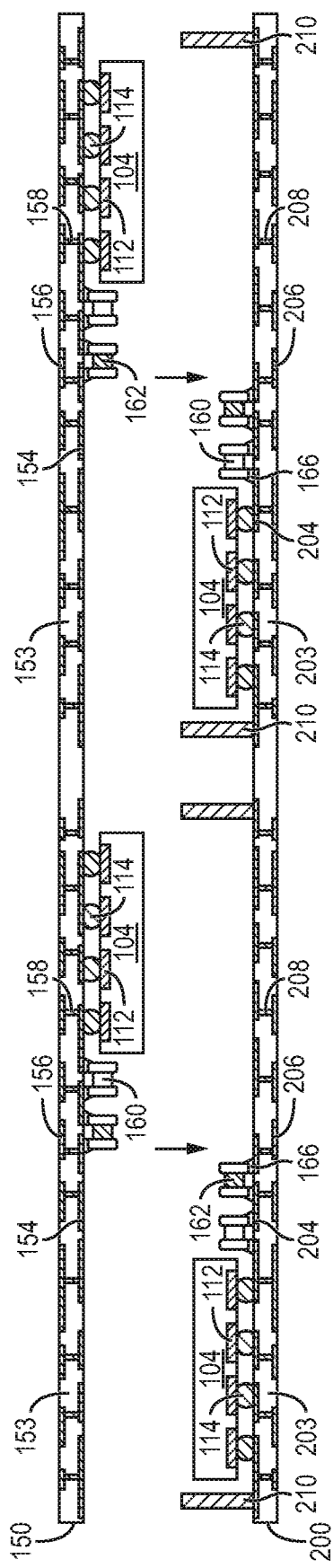
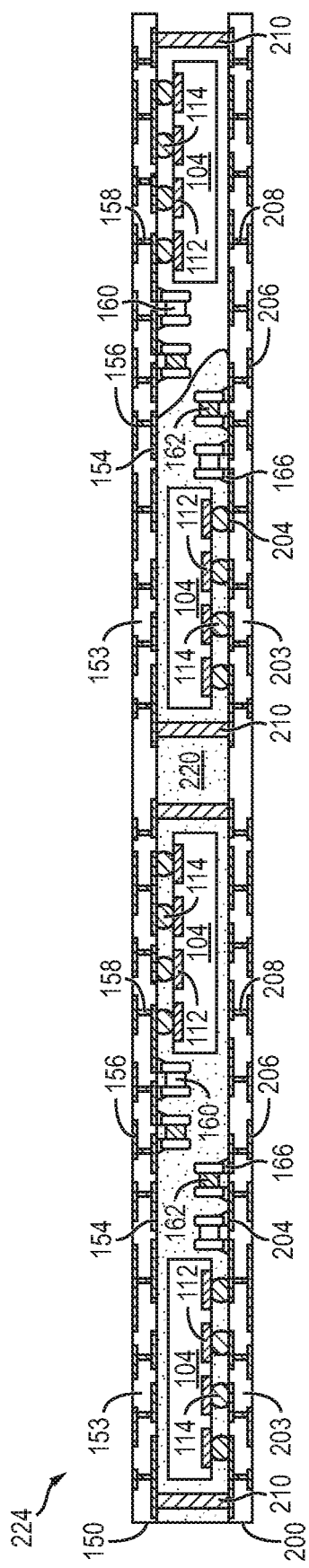
FIG. 4a
FIG. 4b

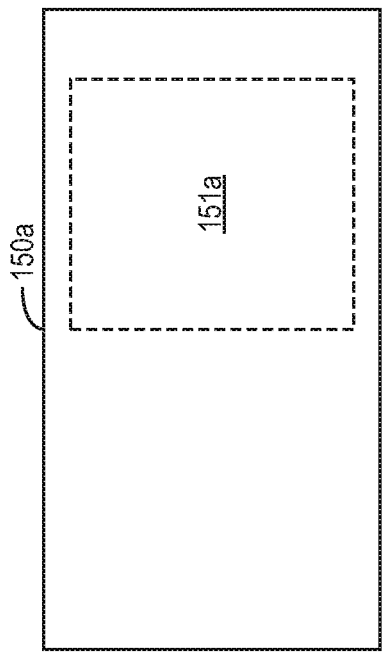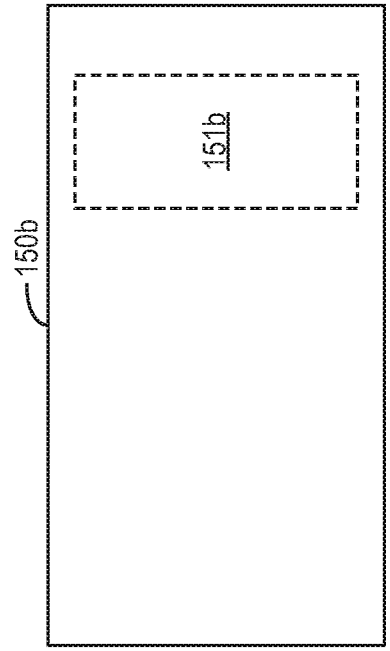
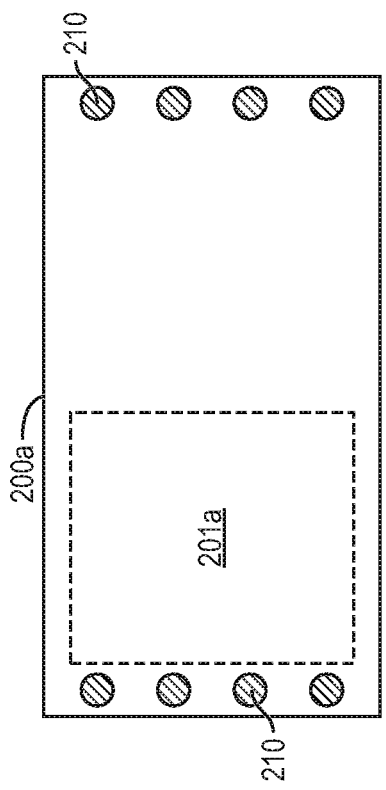
FIG. 6a
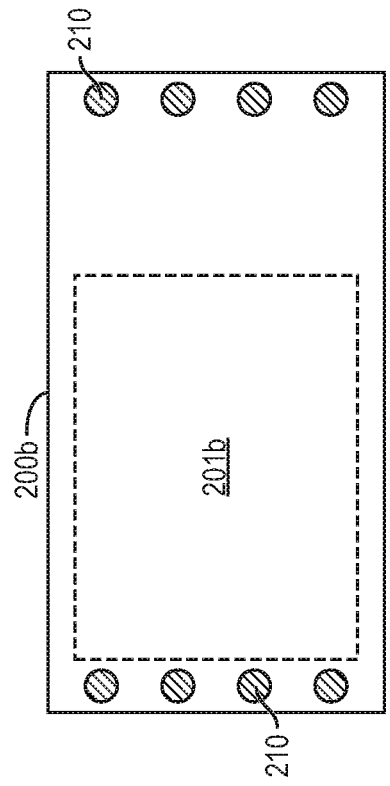
FIG. 6b

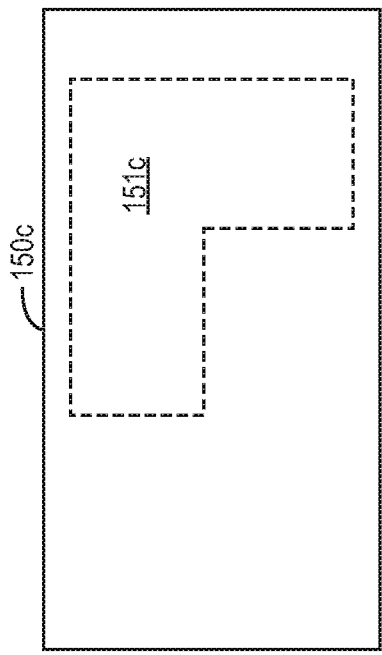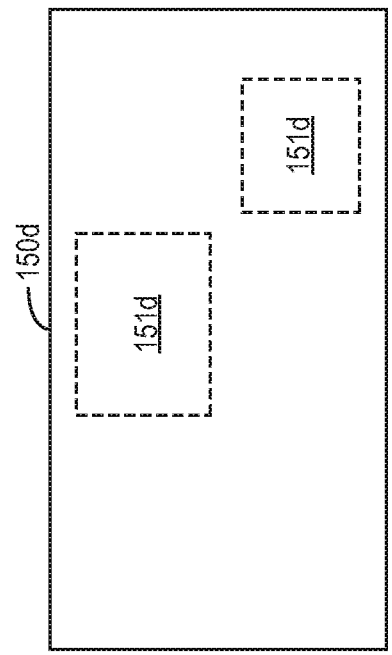
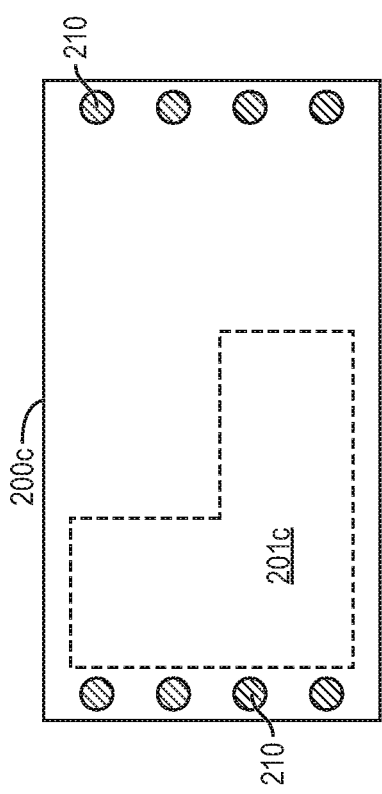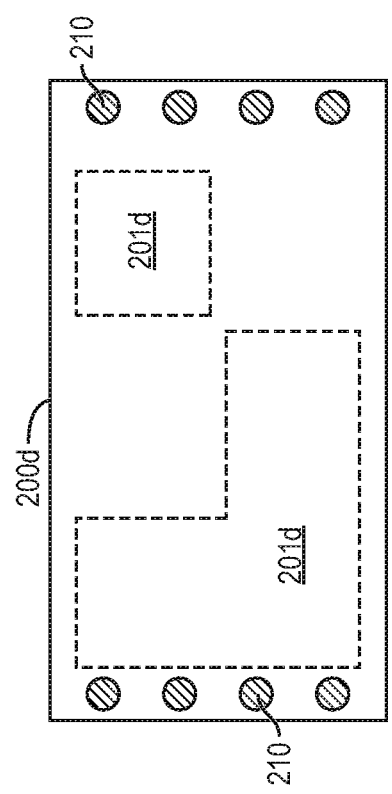
*FIG. 6c*  *FIG. 6d*

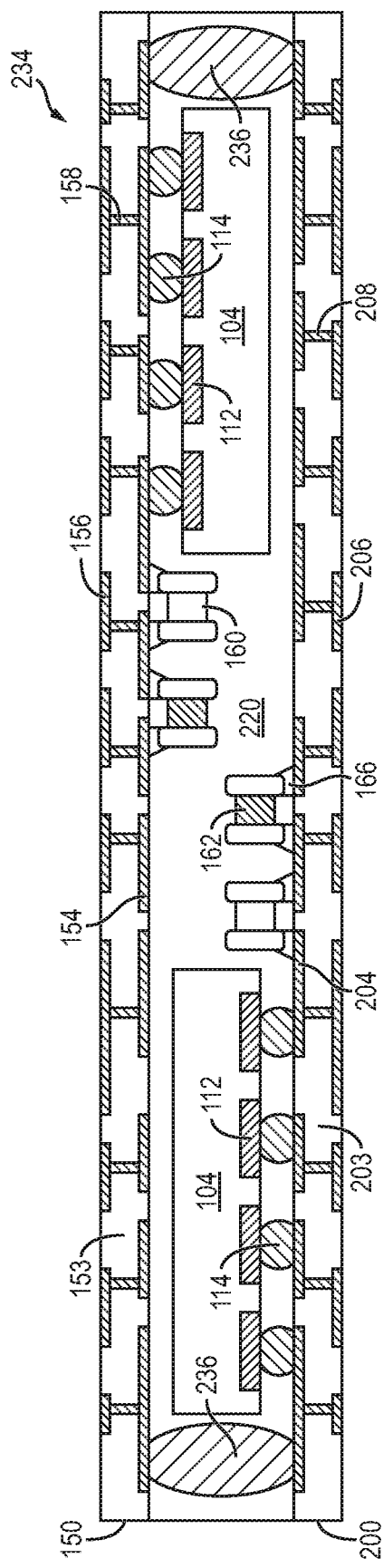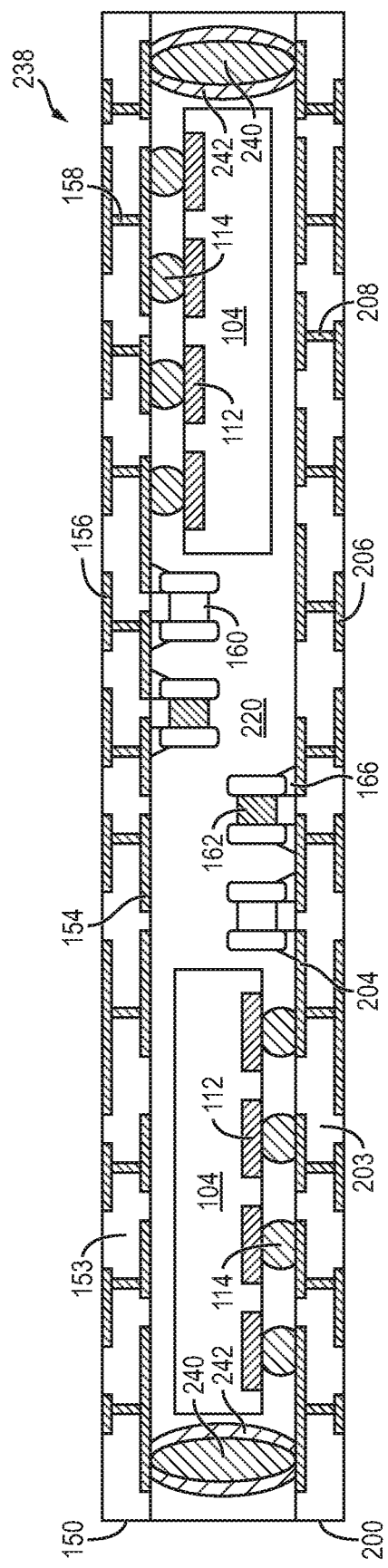

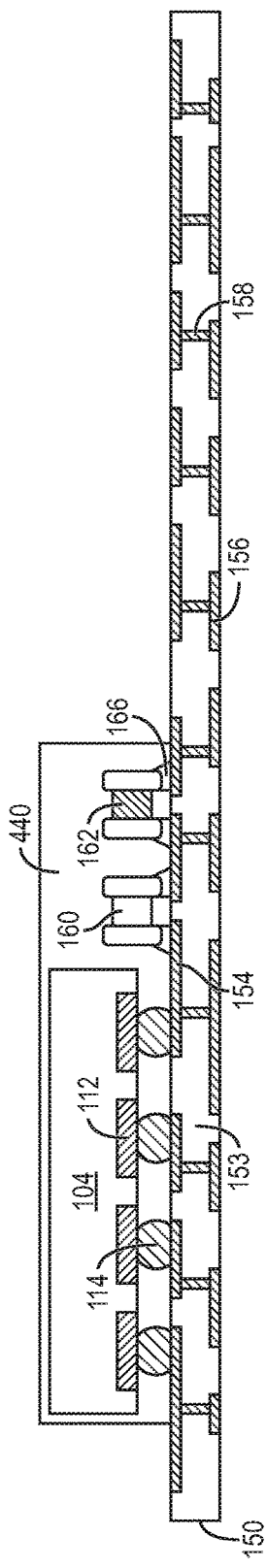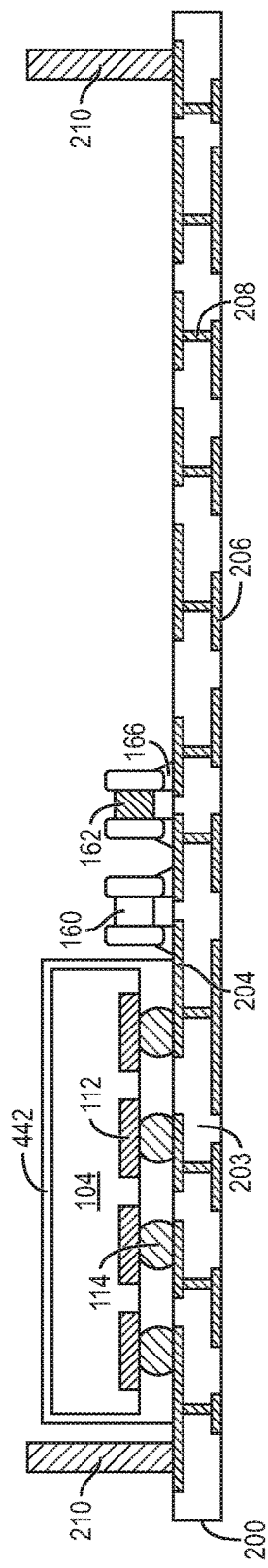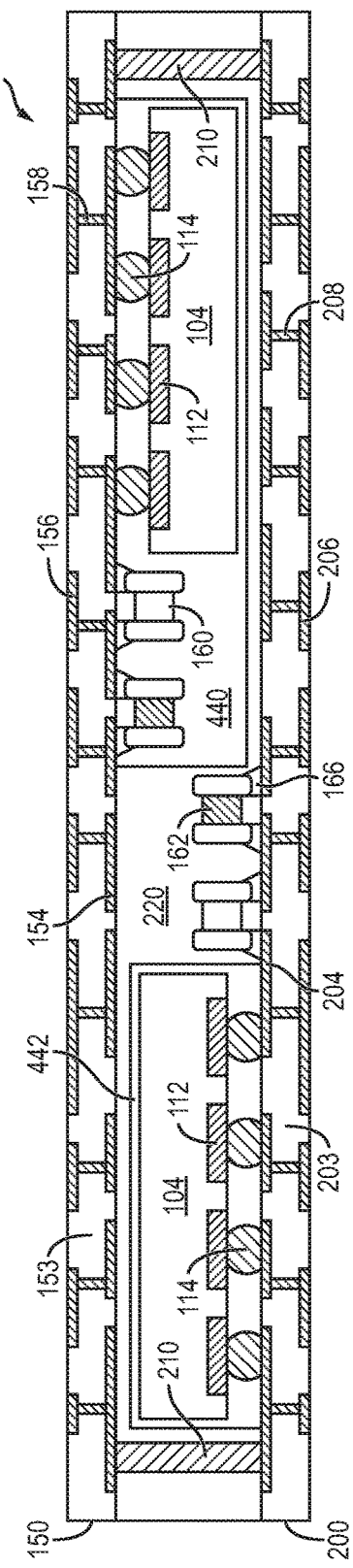

SEMICONDUCTOR DEVICE AND METHOD OF FORMING EMBEDDED DIE SUBSTRATE, AND SYSTEM-IN-PACKAGE MODULES WITH THE SAME

CLAIM OF DOMESTIC PRIORITY

The present application is a division of U.S. patent application Ser. No. 15/706,584, now U.S. Pat. No. 10,468,384, filed Sep. 15, 2017, which application is incorporated herein by reference.

FIELD OF THE INVENTION

The present invention relates in general to semiconductor devices and, more particularly, to a semiconductor device and method of forming an embedded die substrate (EDS), and system-in-package (SiP) modules with the EDS.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photoelectric generation, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor packages are commonly made with several active semiconductor components, discrete passive components, and integrated passive devices (IPDs) packaged together into a single-package system, also known as a system-in-package (SiP) module. SiP modules offer higher density and enhanced electrical functionality relative to traditional semiconductor packaging.

The active and passive components are mounted to a substrate for structural support and electrical interconnect. In more advanced three dimensional (3D) packaging, semiconductor components are embedded into the substrate, sometimes referred to as embedded die in substrate (EDS). With EDS packages, a semiconductor die is embedded within a plurality of laminated layers during formation of the substrate. The semiconductor die is then electrically connected to components on the top and bottom surfaces of the substrate through conductive vias and conductive traces of the substrate.

Manufacturing of EDS requires formation of a substrate around a semiconductor die, which limits the options available for the substrate. In addition, manufacturing defects in the substrate result not only in loss of the substrate, but in an otherwise good semiconductor die as well. Traditional EDS packages have the additional problems of low yield, high cost, high warpage, and low design flexibility. Therefore, a need exists for an EDS, and method of making, that provides higher flexibility in substrate design and component selection and increased manufacturing yield.

BRIEF DESCRIPTION OF THE DRAWINGS

FIGS. 4a-4c illustrate combining the top substrate submodules and bottom substrate submodules into a single substrate with embedded semiconductor components;

FIGS. 6a-6d illustrate potential layouts for components on the top and bottom substrate submodules;

FIGS. 7a-7c illustrate forming the EDS with alternative interconnect structures;

FIGS. 16a-16c illustrate forming the EDS with separately packaged semiconductor components embedded in the EDS;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The term "semiconductor die" as used herein refers to both the singular and plural form of the words, and accordingly, can refer to both a single semiconductor device and multiple semiconductor devices. The term "semiconductor component" as used herein refers to both active devices formed from semiconductor die, and other active or passive components usable with a semiconductor circuit.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
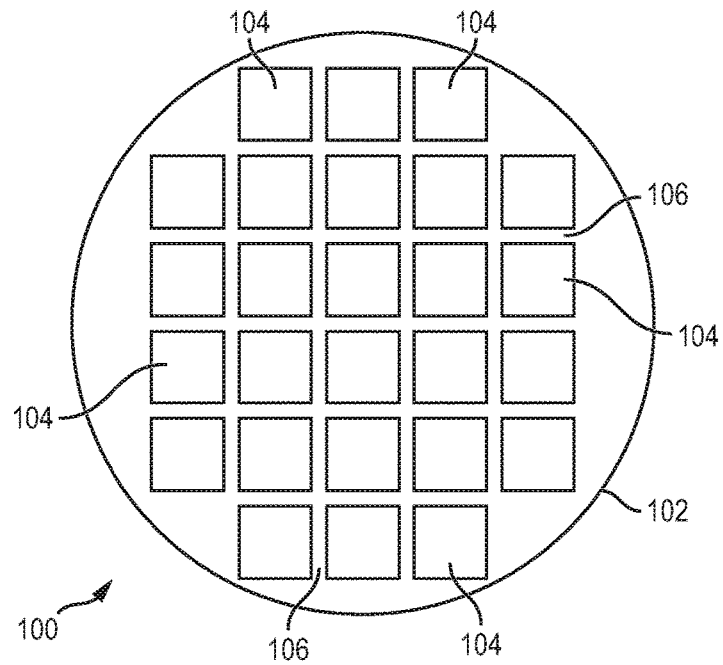
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
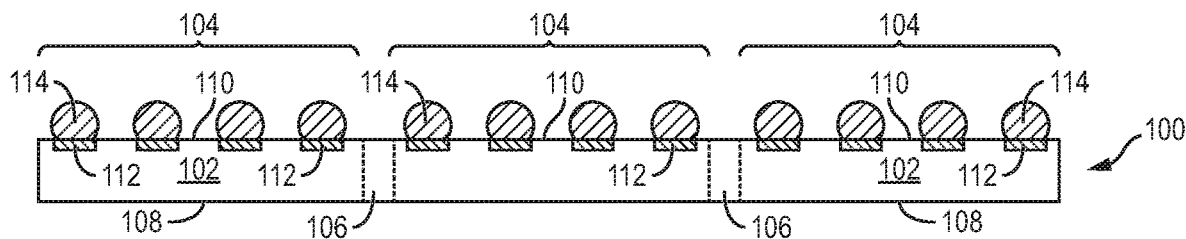

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. The circuit may include one or more transistors, diodes, and other circuit elements formed within active surface 110 to implement analog circuits or digital circuits, such as a digital signal processor (DSP), application specific integrated circuit (ASIC), memory, or other signal processing circuit. Semiconductor die 104 may also contain IPDs, such as inductors, capacitors, and resistors formed in or on interconnect layers over surfaces of the semiconductor die for RF signal processing. In some embodiments, semiconductor die 104 include multiple active surfaces with circuits formed therein or thereon.

An electrically conductive layer 112 is formed over active surface 110 using PVD, CVD, electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits of active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In some embodiments, the bump material is reflowed by heating the material above its melting point to form balls or bumps 114. In one embodiment, bump 114 is formed over an under bump metallization (UBM) having a wetting layer, a barrier layer, and an adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
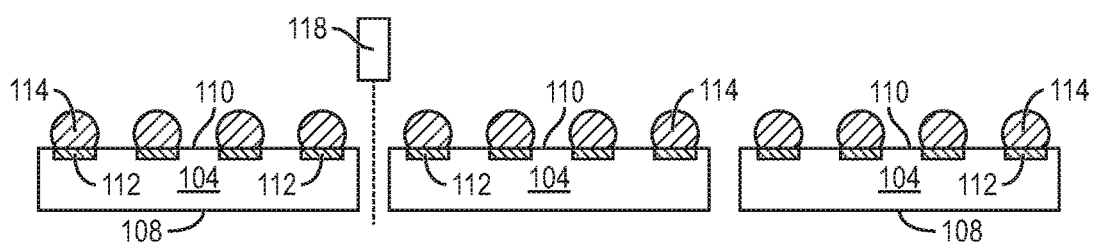

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) before or after singulation.

Figure 2A:
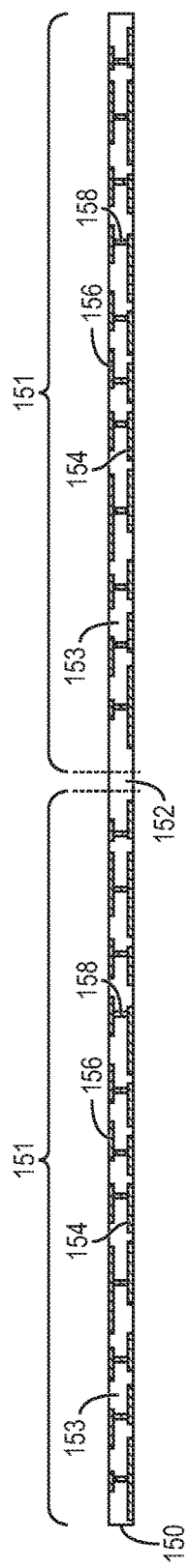
FIGS. 2a-2b illustrate formation of a panel of top substrate submodules.
Figure 2B:
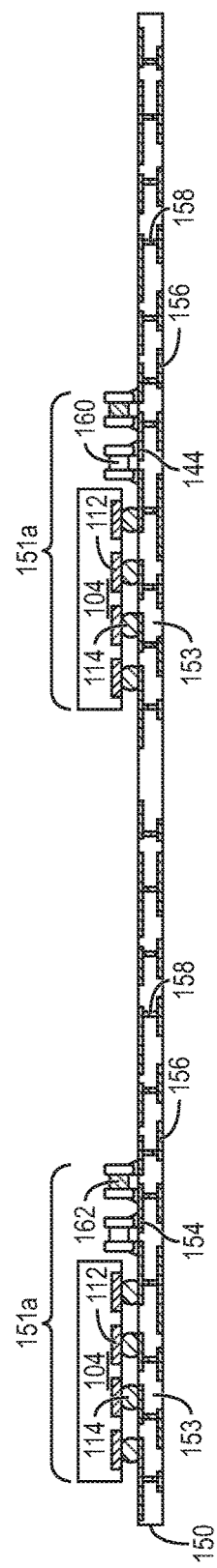

FIGS. 2a-2b illustrate a process of forming a panel of top substrate submodules for combination into a substrate with semiconductor die 104 embedded in the substrate. FIG. 2a shows a cross-sectional view of substrate 150 including a plurality of regions for formation of top substrate submodules 151 separated by saw streets 152. While only two regions for forming submodules 151 are shown, substrate 150 is much larger in other embodiments, with room to form hundreds or thousands of submodules 151 in parallel. Substrate 150 is formed from a base insulating material 153 with conductive layers 154 and 156 formed on the two major surfaces of the insulating layer. In one embodiment, insulating material 153 is a molded substrate. In some embodiments, substrate 150 is formed using a plurality of insulating layers 153 interleaved with a plurality of conductive layers, which allows for more complicated signal routing. Portions of conductive layers 154 and 156 are electrically common or electrically isolated depending on the design and function of the SiP module being formed.

Conductive layers 154 and 156 can be one or more layers of Al, Cu, Sn, Ni, Au, Ag, or other suitable electrically conductive material. Conductive vias 158 extend through insulating layer 153 to electrically connect portions of conductive layer 154 to portions of conductive layer 156. Conductive layers 154 and 156 provide horizontal electrical interconnect across substrate 150, while conductive vias 158 provide vertical electrical interconnect through substrate 150. In one embodiment, conductive vias 158 are formed by providing an opening through insulating layer 153 by etching, drilling, laser ablation, or another suitable process, and then depositing or plating conductive material into the opening. In some embodiments, conductive material for conductive vias 158 is deposited into openings of insulating layer 153 as part of forming conductive layers 154 or 156.

Substrate 150 can also be any suitable laminate interposer, PCB, wafer-form, strip interposer, leadframe, or other type of substrate. Substrate 150 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating layer 153 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Substrate 150 can also be a multi-layer flexible laminate, ceramic, copper clad laminate, glass, or semiconductor wafer including an active surface containing one or more transistors, diodes, and other circuit elements to implement analog or digital circuits.

Top substrate submodules 151 can be tested at the current stage seen in FIG. 2a, prior to mounting semiconductor die and other components on the substrate submodules. In FIG. 2b, semiconductor die 104 and discrete devices 160 and 162 are surface mounted onto conductive layer 154. Semiconductor die 104 can be tested for KGD prior to mounting onto a top substrate submodule 151 to avoid using bad die on good substrate submodules, wasting submodules unnecessarily. In addition, top substrate submodules 151 can be tested prior to mounting components, and submodules with manufacturing defects can be discarded without wasting KGD on a bad substrate. In some embodiments, bad or blank semiconductor die 104 are disposed on bad substrate submodules 151 to keep weight distribution even across substrate 150 and help control warpage.

FIG. 2b shows each submodule 151 having two discrete devices 160 and 162, which can be inductors, capacitors, resistors, or other passive circuit components. Discrete devices 160 and 162 can also be devices with active functionality, e.g., power transistors, transient voltage suppression diodes, etc. In other embodiments, any combination of active and passive devices can be provided on substrate 150 as desired to implement the intended functionality of a final SiP module. In one embodiment, discrete devices 160 and 162 implement a band-pass filter or another radio frequency (RF) signal processing network. In another embodiment, discrete devices 160 and 162 filter a power signal to semiconductor die 104. Discrete devices 160 and 162 can implement any desired electrical function.

Discrete devices 160 and 162 are mechanically bonded and electrically connected to conductive layer 154 through solder or solder paste 166. In one embodiment, solder paste 166 is printed onto substrate 150, reflowed with discrete devices 160 and 162 in physical contact, and then defluxed. Semiconductor die 104 is mechanically bonded and electrically connected to conductive layer 154 through conductive bumps 114. In some embodiments, bumps 114 and solder paste 166 are reflowed at the same time to surface mount all components in a single step. Region 151a indicates the region where active and passive components are located on submodule 151.

Figure 3A:
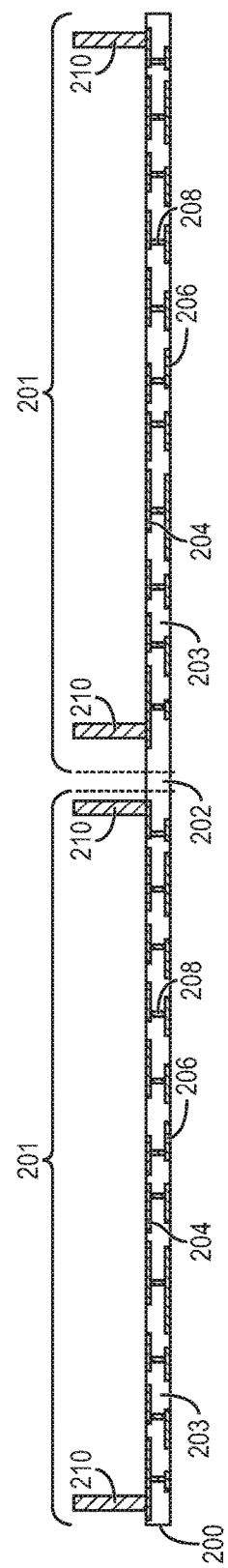
FIGS. 3a-3b illustrate formation of bottom substrate submodules.
Figure 3B:
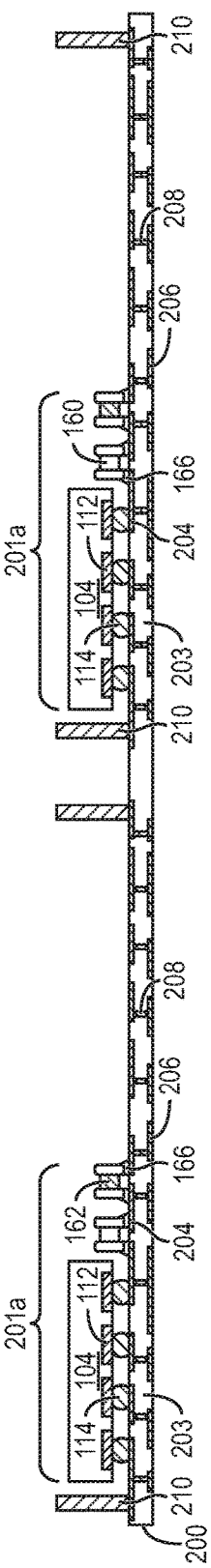

FIGS. 3a-3b illustrate forming bottom substrate submodules. The process begins in FIG. 3a with a substrate 200 having locations to form a plurality of bottom substrate submodules 201 separated by saw streets 202. Substrate 200 is similar to substrate 150. Substrate 200 includes one or more insulating layers 203 and conductive layers 204 and 206 on opposite sides of the substrate. Portions of conductive layers 204 and 206 are electrically connected to each other by conductive vias 208 through substrate 200. Conductive pillars 210 are formed on contact pads of conductive layer 204. Conductive pillars 210 are formed by depositing one or more layers of Al, Cu, Sn, Ni, Au, Ag, or other suitable conductive material into openings of a masking layer. In other embodiments, conductive pillars 210 are formed by another suitable metal deposition technique. Much like top substrate submodules 151, bottom substrate submodules 201 can be tested prior to mounting components, and the components can be tested in advance of mounting as well.

In FIG. 3b, semiconductor die 104 and discrete devices 160-162 are surface mounted onto substrate 200 and electrically connected to conductive layer 204 by solder paste 166 and conductive bumps 114. Semiconductor die 104 and discrete devices 160-162 of the bottom substrate submodules 201 can be identical to or different from top substrate submodules 151. In one embodiment, semiconductor die 104 are identical memory chips for both substrates 150 and 200 and used together with a microprocessor provided at a later step. In another embodiment, one semiconductor die 104 on substrate 150 or 200 is a memory chip, while the other semiconductor die 104 is a microprocessor. Region 201a indicates the region where active and passive components are located on submodule 201.

Figure 4C:
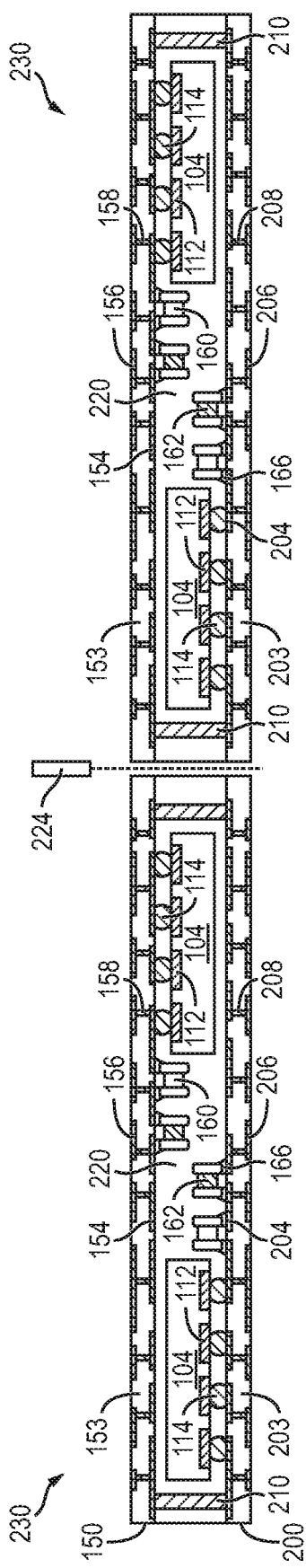

FIGS. 4a-4c illustrate combining substrate submodules 151 and 201 into an embedded die substrate (EDS). In FIG. 4a, substrate 150 with top substrate submodules 151 is flipped and disposed over substrate 200 with bottom substrate submodules 201. In some embodiments, substrate 150, substrate 200, or both can be singulated prior to combination of the top and bottom substrate submodules. Components on top substrate submodules 151 and bottom substrate submodules 201 are limited to within regions 151a and 201a, respectively. The layout of regions 151a and 201a are designed so that the components do not interfere with each other when top substrate submodule 151 is flipped and mounted over bottom substrate submodule 201. That is, when one of the substrate submodules is flipped and aligned with the other submodule, all of the components of both submodules are outside of the footprints of components of each other. As oriented in FIG. 4a, submodules 151 include components only on the right half of the submodules, while submodules 201 include components only on the left half. Other layouts are possible, as explained below with reference to FIGS. 6a-6d.

While FIG. 4a illustrates stacking substrate 150 over substrate 200, substrate 200 can also be on the top in other embodiments. In one embodiment, the bottom substrate 150 or 200 is disposed on a carrier for physical support with optional double-sided tape, thermal release layer, UV release layer, or other appropriate interface layer. In some embodiments, the top substrate 150 or 200 is singulated prior to disposing on the bottom substrate 150 or 200.

FIG. 4b shows top submodules 151 disposed onto bottom submodules 201. Semiconductor die 104 and discrete devices 160-162 on top submodules 151 extend within a height of the semiconductor die and discrete devices on bottom submodules 201 without contact between the top and bottom components. Keeping top and bottom components outside of the footprint of each other allows formation of a thinner substrate because top and bottom substrate components can occupy the same vertical region. However, in embodiments where the design parameters allow, a portion or all components of top submodule 151 and bottom submodule 201 can be directly over each other in the final device.

In FIG. 4b, an encapsulant or molding compound 220 is deposited between substrates 150 and 200, and over semiconductor die 104 and discrete devices 160-162 using a paste printing, compressive molding, transfer molding, liquid encapsulant molding, vacuum lamination, spin coating, or other suitable applicator. Encapsulant 220 can be polymer composite material, such as epoxy resin, epoxy acrylate, or polymer with or without filler. Encapsulant 220 is nonconductive, provides structural support, and environmentally protects the semiconductor device from external elements and contaminants. Encapsulant 220 flows below semiconductor die 104 between conductive bumps 114, and below discrete devices 160-162 between solder paste 166, to completely fill the space between substrates 150 and 200. Substrates 150 and 200 with encapsulant 220 form a panel 224.

Figure 5:
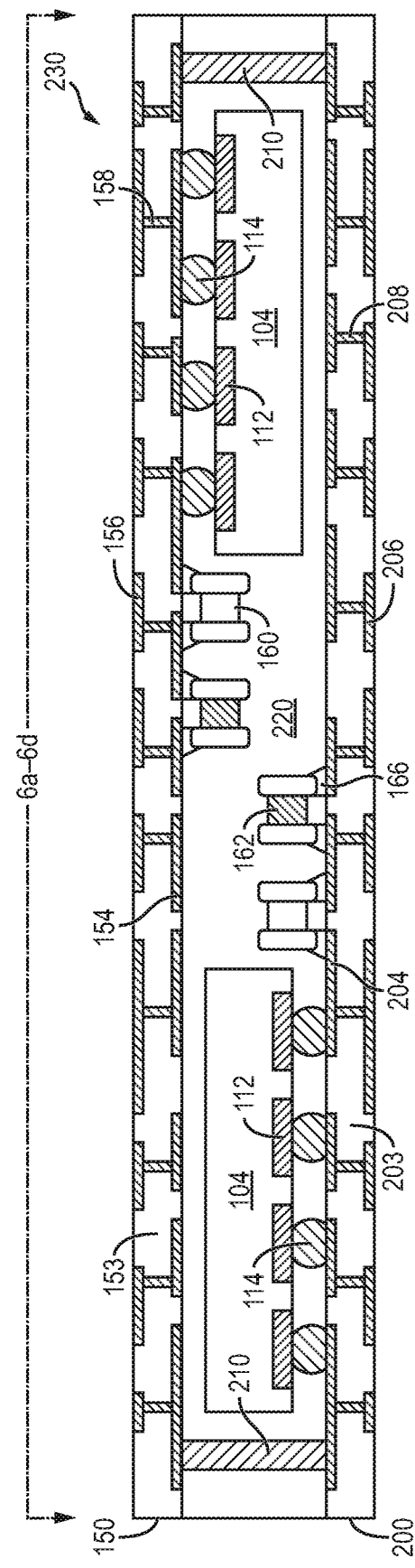
FIG. 5 illustrates an EDS formed from the combination of top and bottom substrate submodules.

In FIG. 4c, panel 224 is singulated through substrate 150, substrate 200, and encapsulant 220 into a plurality of embedded die substrates (EDS) 230. FIG. 5 illustrates a completed EDS 230. In some embodiments, panel 224 is not singulated into individual EDS 230 until a later manufacturing stage, especially when additional components are mounted onto substrate 150 or 200 as shown in a variety of embodiments below. Discrete devices 160 and 162 are electrically coupled to semiconductor die 104 of the same substrate 150 or 200 by conductive layers 154, 156, 204, and 206. Semiconductor die 104 and discrete devices 160-162 of one substrate are electrically connected to the components on the opposite substrate through pillars 210. Discrete devices 160-162 are electrically connected to semiconductor die 104 to provide desired passive functionality. EDS 230 in FIG. 5 constitutes a semiconductor package. Either substrate 150 or substrate 200 can be bumped opposite encapsulant 220, and then EDS 230 mounted to a printed circuit board (PCB) or other substrate of an electronic device using the bumps. Additional active or passive devices can be mounted on top of the opposite substrate and be encapsulated or remain exposed in the final electronic device.

EDS 230 is formed by disposing components on two separate substrates, disposing the substrates on each other with the components between the substrates, and then depositing an encapsulant between the two substrates to cover the components. The method of forming EDS 230 allows for a flexible design of the substrate and components, increases yield, reduces costs, and helps control warpage during manufacturing. Substrate submodules 151 and 201 can be tested prior to mounting semiconductor die 104, reducing the number of wasted die.

The components on substrates 150 and 200 are formed, mounted, or disposed within areas that are outside of a footprint of each other when the substrates are combined to make EDS 230. In the above embodiment, the components on substrate 200 are formed on one half of the device, shown in FIG. 6a as region 201a of substrate 200a. The components on substrate 150 are formed in the other half of the device, shown in FIG. 6a as region 151a of substrate 150a. FIGS. 6a-6d illustrate different embodiments of substrates 150 and 200 when viewed from the top of EDS 230, as indicated by line 6a-6d in FIG. 5. When substrates 150a and 200a are stacked, the regions 151a and 201a do not overlap. The components on substrates 150 and 200 can lie within the same vertical height because the components are in different locations horizontally. Each component on substrate 150 and 200 can occupy up to the entire height between substrates 150 and 200 because the opposite substrate has no interfering component. Having such non-overlapping components on the two substrates allows taller components on the substrates and/or allows the substrates to be mounted closer to each other with shorter pillars 210.

The components on substrates 150 and 200 can be disposed in any desired layout, and the layouts on substrates 150 and 200 do not need to be symmetrical. FIG. 6b illustrates region 201b of substrate 200b being significantly larger than region 151b of substrate 150b. In the embodiment of FIG. 6b, more components, components with larger footprints, or both are disposed on substrate 200b within region 201b compared to region 151b of substrate 150b. However, the regions 151b and 201b remain non-overlapping so that the components of opposite substrates still do not interfere with each other.

FIG. 6c shows region 201c of substrate 200c and region 151c of substrate 150c as matching non-rectangular shapes that do not overlap each other. In FIG. 6d, regions 201d and 151d are discontinuous regions. Components can be disposed on substrates 150 and 200 in any desired pattern. In some embodiments, some components of the opposite substrates overlap, while others are non-overlapping. For instance, shorter components might be placed on top of each other connected to their respective substrates 150 and 200, while other taller components are disposed in locations where the opposite substrate has no component. In one embodiment, semiconductor die 104 are backgrinded to a height less than half the distance between substrates 150 and 200, so that both semiconductor die will fit between the substrates on top of each other when aligned. Each of the substrates includes discrete components around the semiconductor die that are significantly taller than the die, and are therefore disposed in non-overlapping regions around the semiconductor die.

Figure 7C:
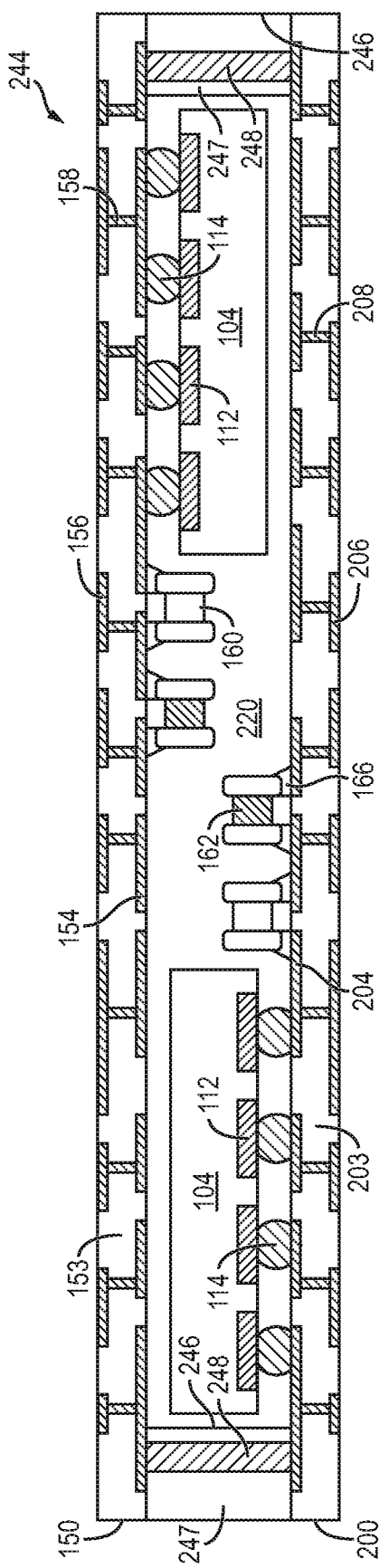

FIGS. 7a-7c illustrate options for the vertical interconnect structures that electrically connect substrate 150 to substrate 200 as alternatives to conductive pillars 210. FIG. 7a shows EDS 234 with conductive bumps 236 mounted onto conductive layer 204 of substrate 200 in place of conductive pillars 210. Conductive bumps 236 are reflowed or thermocompression bonded to attach the bumps to conductive layer 204. Substrate 150 is disposed over the bumps. The bumps are reflowed onto conductive layer 154 to physically and electrically connect substrate 150 to substrate 200. In other embodiments, bumps 236 are thermocompression bonded to substrate 150. Bumps 236 are similar to bumps 114.

FIG. 7b illustrates EDS 238 with conductive pillars 210 replaced by copper core solder balls (CCSB) 240-242. CCSB are formed using a copper core 240 coated in solder 242. Solder 242 is plated onto copper core 240 in some embodiments. In one embodiment, a layer of Nickel is plated between solder 242 and copper core 240. CCSB 240-242 are used similarly to conductive bumps 236. CCSB offer improved resistance to electromigration, provide a more solid bump to maintain an offset between substrates 150 and 200, and increase thermal conductivity between the substrates.

FIG. 7c illustrates EDS 244 using e-Bar or PCB units 246 for electrical interconnection between substrates 150 and 200. PCB units 246 include a core substrate 247 with conductive vias 248 formed through the core substrate. In some embodiments, contact pads are formed on the top and bottom surfaces of PCB units 246. Solder mask layers can be used over the contact pads. PCB units 246 are mounted onto substrate 200 using solder or solder paste between vias 248 and conductive layer 204 in some embodiments. Additional solder or solder paste may be used to connect substrate 150 to vias 248. In some embodiments, each PCB unit 246 extends between two adjacent devices 230 in panel 224, and singulating the panel in FIG. 4c cuts through the PCB units. Any of the previously described or following embodiments can be formed using bumps 236, CCSB 240-242, or PCB units 246 instead of conductive pillars 210.

Figure 8A:
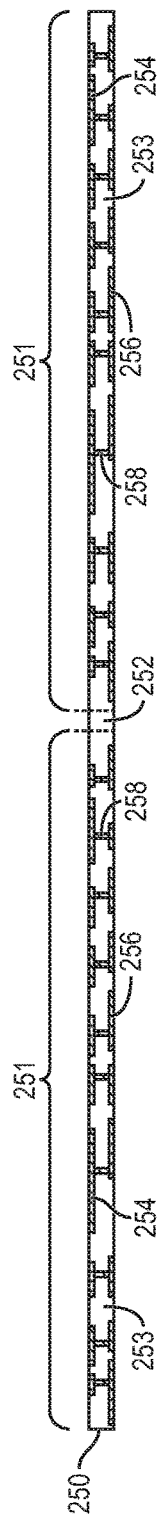
FIGS. 8a-8d illustrate forming a top SiP submodule for use with the EDS.

FIGS. 8a-8d illustrate a process of forming a panel of top SiP submodules for combination with EDS 230 into a system-in-package (SiP) module. FIG. 8a shows a cross-sectional view of substrate 250 including a plurality of regions for formation of top SiP submodules 251 separated by saw streets 252. While only two regions for forming submodules 251 are shown, substrate 250 is much larger in other embodiments, with room to form hundreds or thousands of submodules 251 in parallel. Substrate 250 is formed from a base insulating material 253 with conductive layers 254 and 256 formed on the two major surfaces of the insulating layer. Substrate 250 is substantially similar to the description of substrates 150 and 200 above, although some characteristics may differ among the substrates.

Figure 8B:
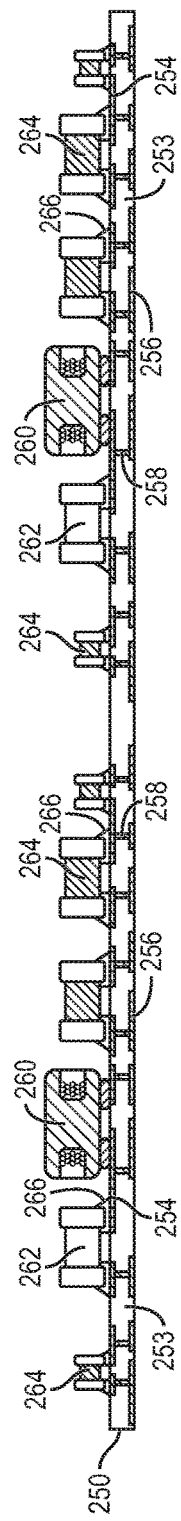

In FIG. 8b, discrete devices 260, 262, and 264 are surface mounted onto conductive layer 254. FIG. 8b shows inductors 260, resistors 262, and capacitors 264 mounted onto substrate 250, but any combination of active and passive devices can be provided as desired to implement the intended functionality of a SiP module. In one embodiment, discrete devices 260-264 implement a band-pass filter or another RF signal processing network. Discrete devices 260-264 are mechanically bonded and electrically connected to conductive layer 254 through solder or solder paste 266. In one embodiment, solder paste 266 is printed onto substrate 250, reflowed with discrete devices 260-264 in physical contact, and then defluxed.

Figure 8C:
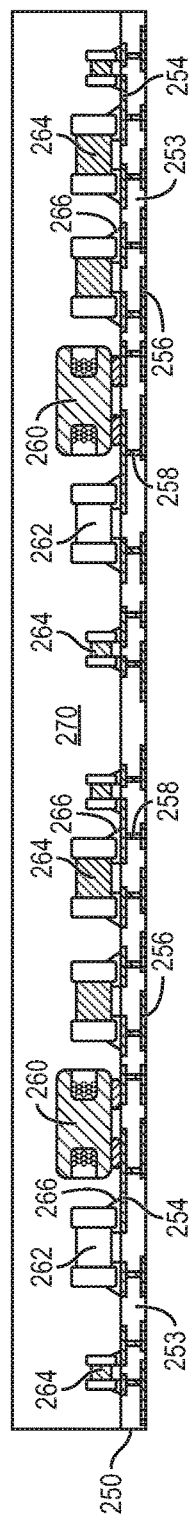

In FIG. 8c, an encapsulant or molding compound 270 is deposited over discrete devices 260-264 and substrate 250. Encapsulant 270 is similar to encapsulant 220. In some embodiments, encapsulant 270 is deposited with a thickness to completely cover discrete devices 260-264. In other embodiments, active or passive components mounted on substrate 250 can remain exposed from encapsulant 270 by using film-assisted molding.

Figure 8D:
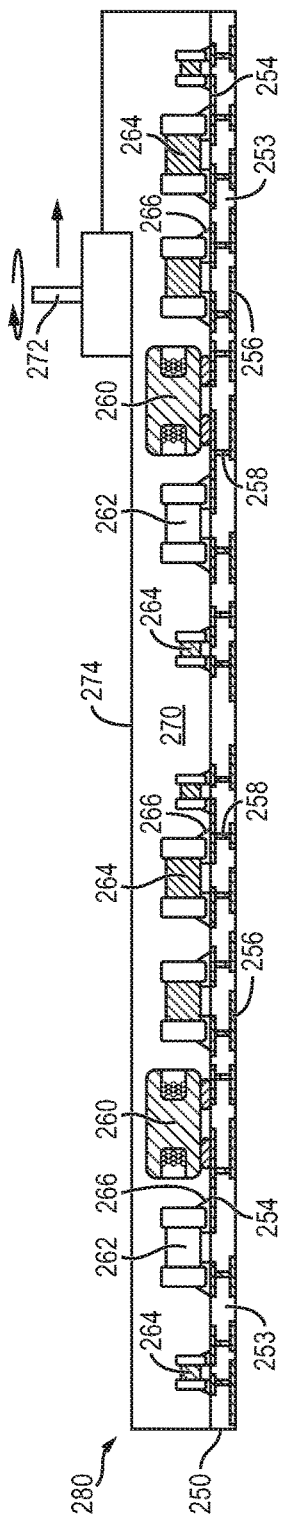

In FIG. 8d, a portion of encapsulant 270 is optionally removed by grinder 272 to expose or create a new back surface 274 of encapsulant 270. Grinder 272 planarizes encapsulant 270 to form surface 274. Alternatively, encapsulant 270 is planarized using chemical mechanical planarization (CMP), an etching process, or laser direct ablation (LDA). In some embodiments, grinder 272 also planarizes some active or passive components disposed on substrate 250 along with encapsulant 270. Molding encapsulant 270 to a greater thickness than necessary and then backgrinding helps to control panel warpage. Encapsulating substrate 250 and discrete devices 260-264 creates a strip or panel 280 of top SiP submodules 251.

Figure 9:
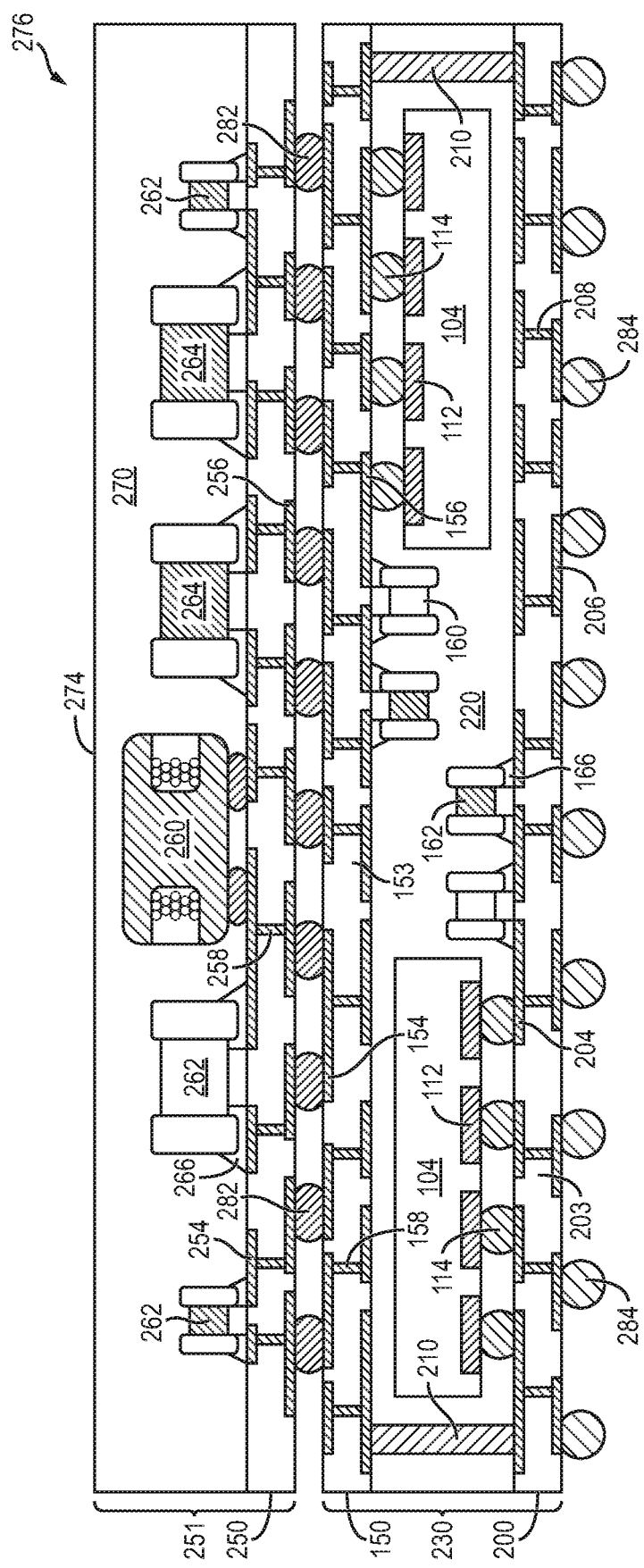
FIG. 9 illustrates a SiP module with the EDS and the top SiP submodule.

FIG. 9 illustrates one of the top SiP submodules 251 disposed on EDS 230 to form a SiP module 276. SiP submodules 251 can be singulated from panel 280 and disposed on singulated EDS 230. In one embodiment, singulated SiP submodules 251 are disposed on panel 224 prior to singulation into individual EDS 230. In another embodiment, panel 280 is disposed on panel 224, and both panels are singulated together after conductive bumps 282 are reflowed to physically and electrically connect the panels together. Conductive bumps 282 are reflowed between EDS 230 and top SiP submodule 251 for mechanical bonding and electrical interconnection between substrate 250 and substrate 150. Semiconductor die 104 are electrically connected to discrete devices 260-264 through conductive layers 204, 206, 154, 156, 254, and 256, conductive vias 158, 208, and 258, conductive pillars 210, and conductive bumps 282. Semiconductor die 104 and discrete devices 160, 162, 260, 262, and 264 are electrically coupled to conductive bumps 284 through substrates 150, 200, and 250, conductive bumps 282, and conductive pillars 210.

In other embodiments, bumps 282 are thermocompression bonded. Thermocompression bonding can occur separately for each top SiP submodule 251, or each top SiP submodule can be gang thermocompression bonded to panel 224 at once. Bumps 282 are formed similarly to bumps 114 of semiconductor die 104. Bumps 282 can be formed on substrate 250 before or after singulating panel 280 into top SiP submodules 251, or can be formed on substrate 150.

Figure 19A:
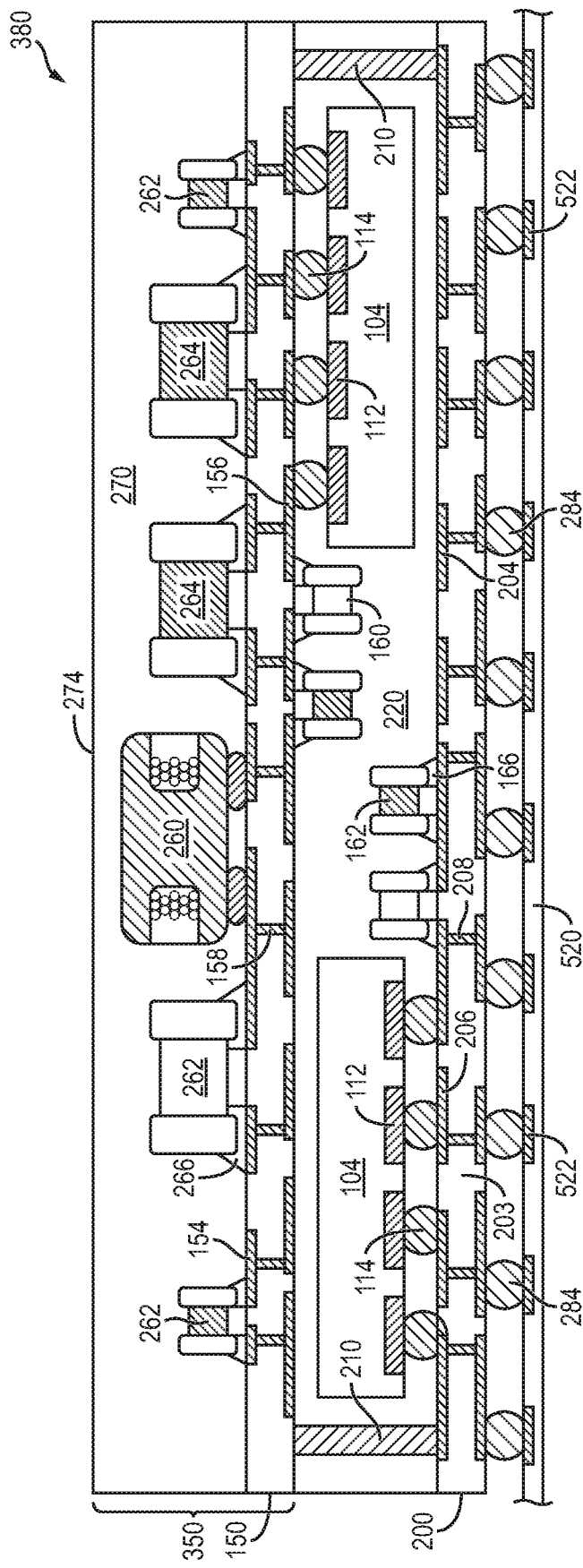
FIGS. 19a-19b illustrate a printed circuit board (PCB) with a SiP module mounted to a surface of the PCB.
Figure 19B:
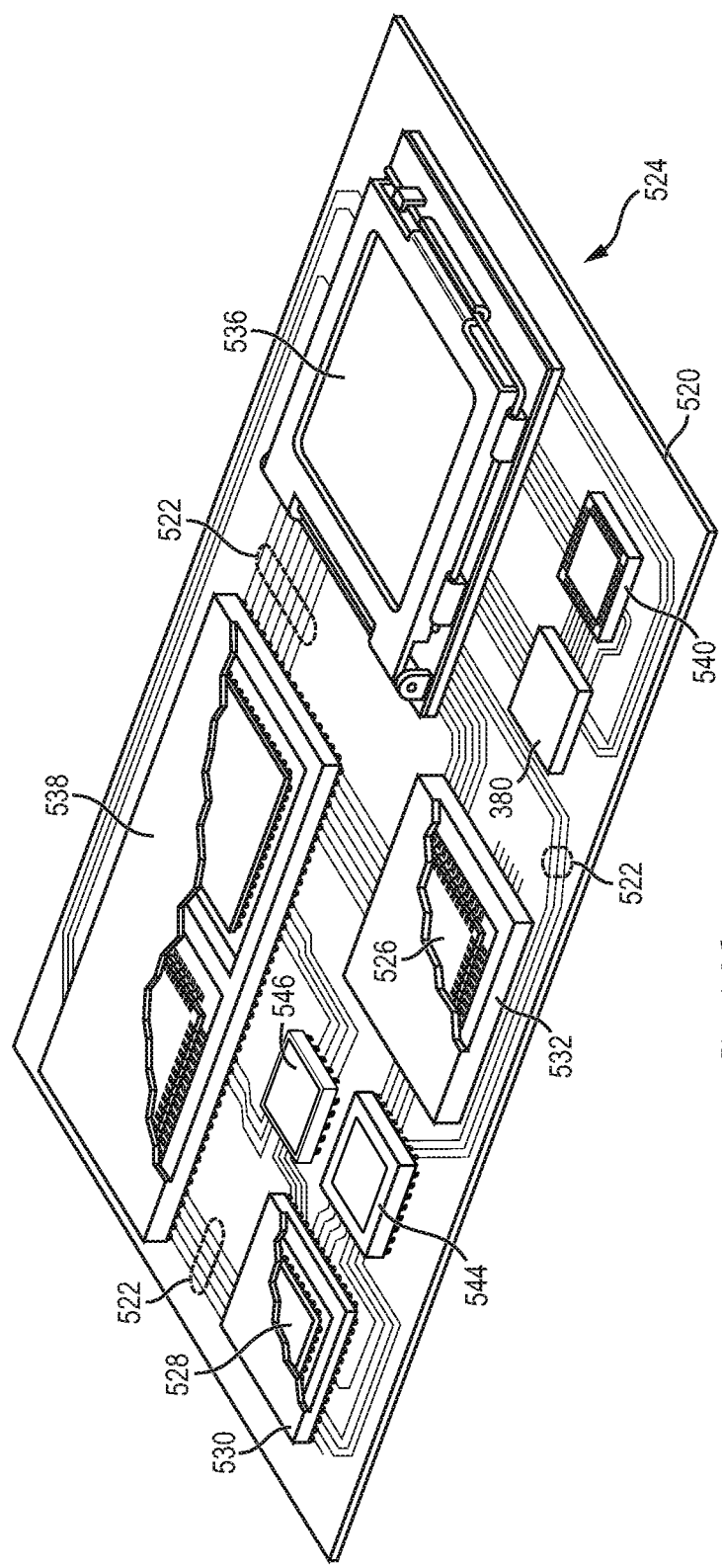

Bumps 284 are formed on conductive layer 206. Bumps 284 are applied in a similar manner as bumps 114. Bumps 284 are formed on conductive layer 206 prior to singulation of panel 224 into EDS 230 in some embodiments. Bumps 284 are used to mount SiP module 276 to a larger substrate of an electronic device as shown in FIGS. 19a-19b.

Figure 10:
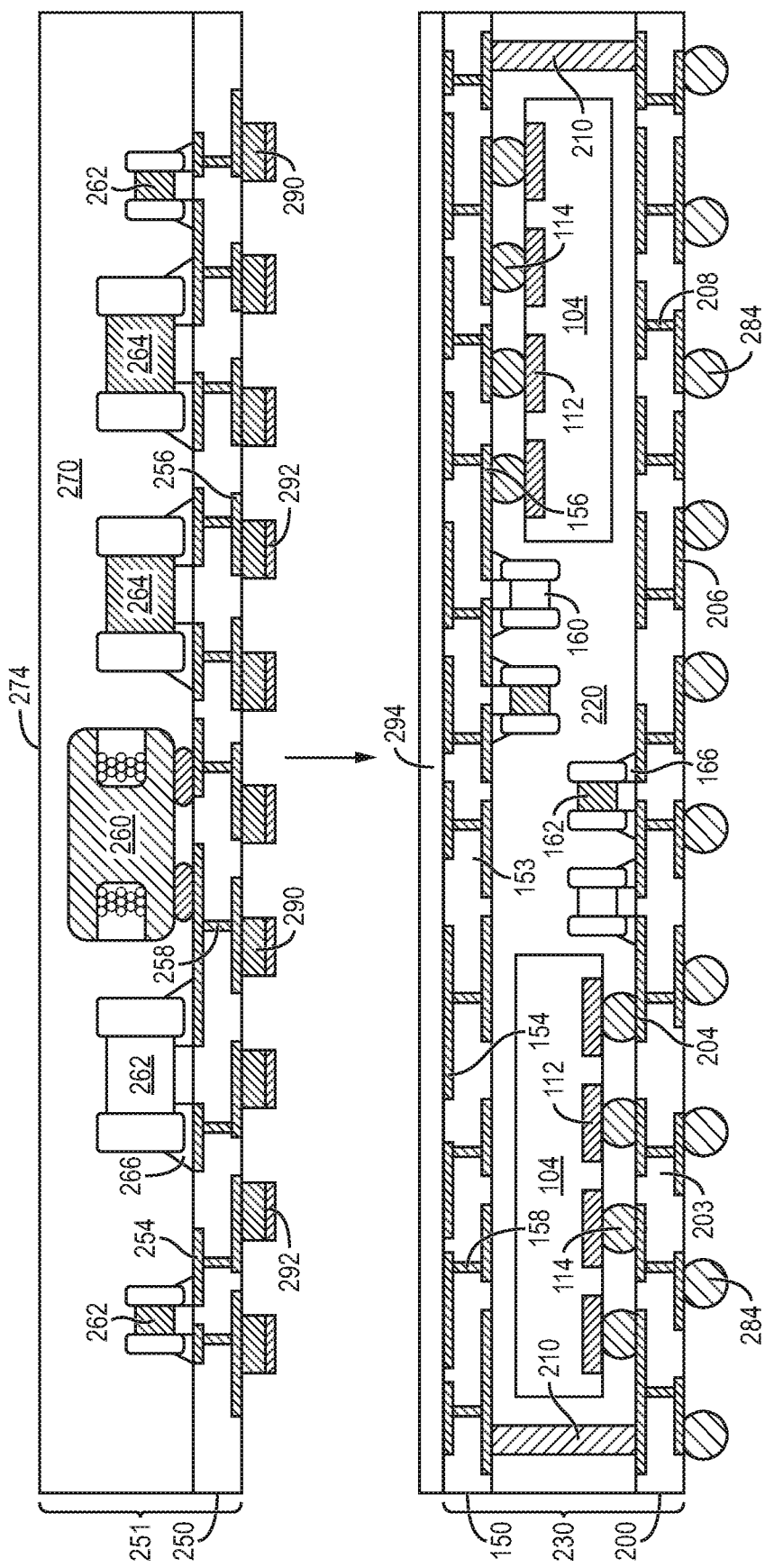
FIG. 10 illustrates mounting the top SiP submodule to the EDS by thermocompression with conductive micro pillars.

FIG. 10 illustrates an alternative embodiment with conductive bumps 282 replaced by conductive micro pillars 290. Micro pillars 290 are formed by plating copper or another appropriate conductive material onto contact pads of conductive layer 256 in one embodiment. Solder cap 292 is plated onto micro pillars 290. In one embodiment, micro pillars 290 and solder caps 292 are deposited into common masking layer openings with each other. An optional non-conductive film (NCF) or paste (NCP) 294 is disposed on substrate 150 to aid in thermocompression bonding of solder cap 292 to conductive layer 156. Solder caps 292 can alternatively be reflowed onto conductive layer 156 with or without NCP 294. Micro pillars 290 can be used with any of the above or below described embodiments where SiP submodules are mounted to the top or bottom of EDS 230.

FIGS. 11a-11f illustrate forming bottom SiP submodules. The process begins in FIG. 11a with a substrate 300 having locations to form a plurality of bottom SiP submodules 301 separated by saw streets 302, similar to substrates 150, 200, and 250. Substrate 300 includes one or more insulating layers 303 and conductive layers 304 and 306 on opposite sides of the substrate. Portions of conductive layers 304 and 306 are electrically connected to each other by conductive vias 308 through substrate 300. Conductive pillars 310 are formed on contact pads of conductive layer 304. Conductive pillars 310 are formed by depositing one or more layers of Al, Cu, Sn, Ni, Au, Ag, or other suitable conductive material into openings of a masking layer. In other embodiments, conductive pillars 310 are formed by another suitable metal deposition technique. In some embodiments, conductive bumps 236, CCSB 240-242, or PCB units 246 are used in place of conductive pillars 310.

Figure 11A:
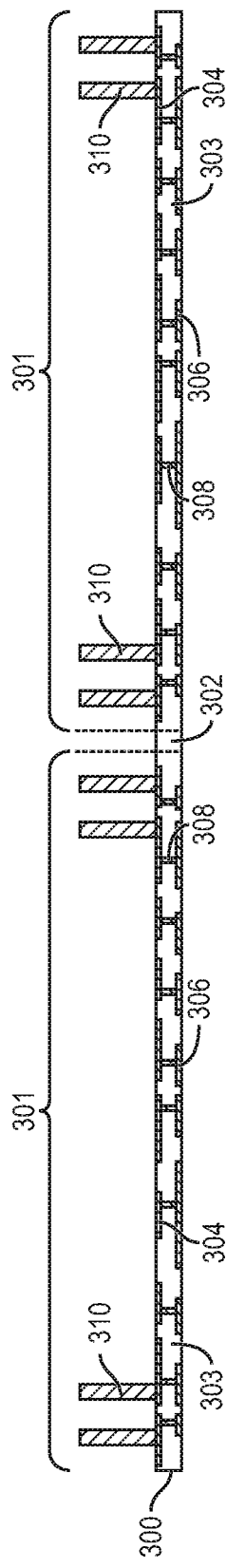
FIGS. 11a-11f illustrate forming a bottom SiP submodule for use with the EDS.
Figure 11B:
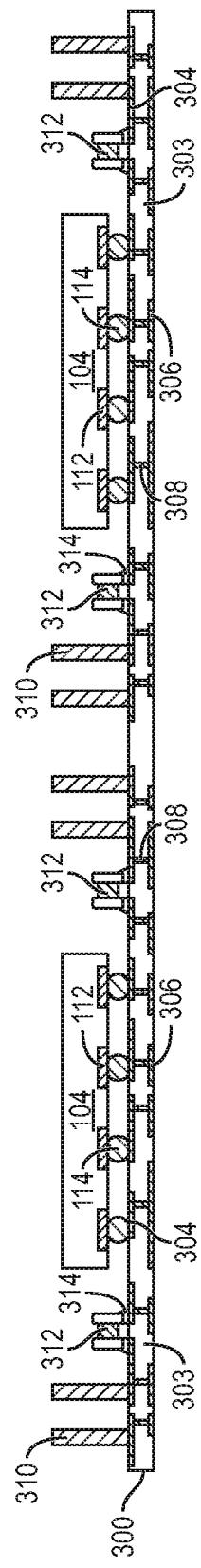
Figure 11C:
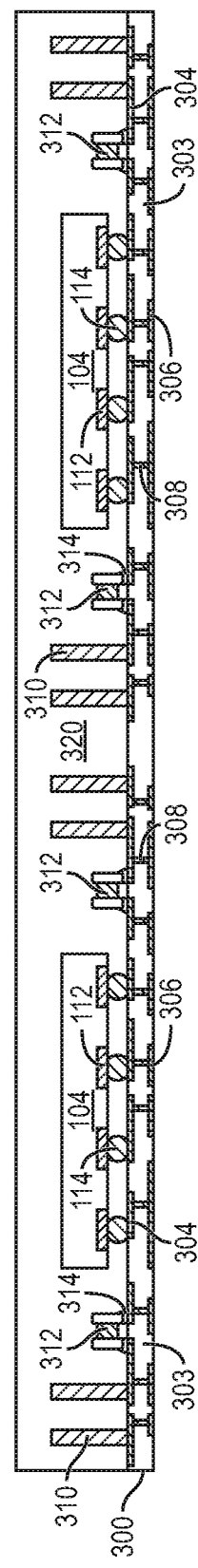
Figure 11D:
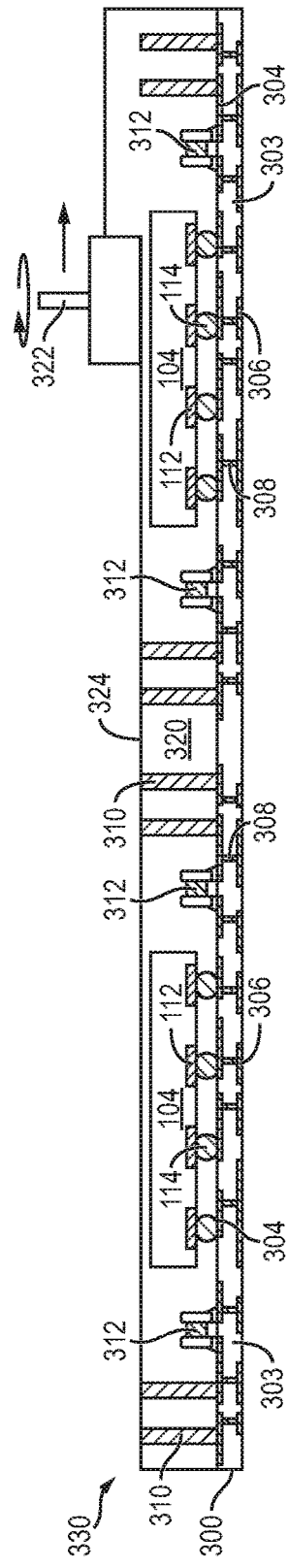

In FIG. 11b, semiconductor die 104 and discrete devices 312 are surface mounted onto substrate 300 and electrically connected to conductive layer 304 by solder paste 314 and conductive bumps 114. Semiconductor die 104 can perform the same function or a different function from semiconductor die 104 of EDS 230. FIG. 11c shows an encapsulant 320 deposited over substrate 300, conductive pillars 310, semiconductor die 104, and discrete devices 312, similar to encapsulant 220. Encapsulant 320 is backgrinded using grinder 322 in FIG. 11d. Backgrinding panel 330 results in a new back surface 324 of encapsulant 320 being coplanar with top surfaces of conductive pillars 310. In some embodiments, semiconductor die 104 is exposed or further backgrinded in the same step. In one embodiment, some encapsulant remains covering conductive pillars 310 after backgrinding.

Figure 11E:
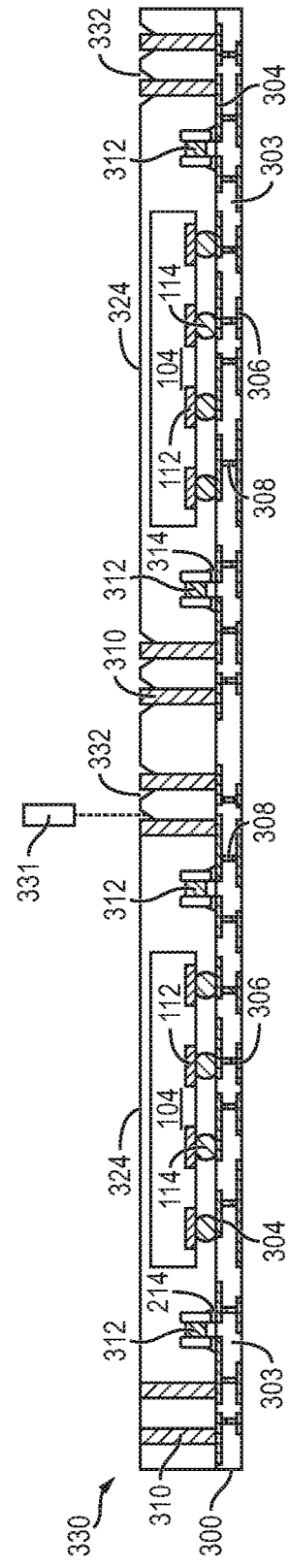

In FIG. 11e, side surfaces of conductive pillars 310 are exposed from the encapsulant by using LDA with laser 331, or another suitable etching process, to form optional notches or grooves 332 either partially around or totally surrounding the conductive pillars. Each individual groove 332 can extend completely around one conductive pillar 310 in approximately a circle. In one embodiment, a surface of encapsulant 320 within groove 332 extends approximately linearly from conductive pillar 310 to surface 324 of the encapsulant around an entire perimeter of each conductive pillar. In other embodiments, the surface of encapsulant 320 within groove 332 includes other profile shapes. In embodiments where encapsulant 320 remains covering conductive pillars 310 after backgrinding, or no backgrinding is performed, laser 331 is also used to expose the top surface of the conductive pillars.

Figure 11F:
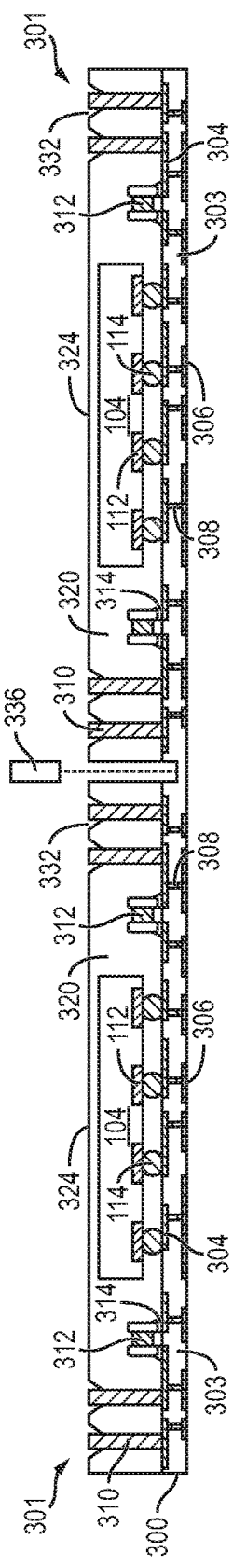

In FIG. 11f, panel 330 is singulated through substrate 300 and encapsulant 320 into a plurality of bottom SiP submodules 301 using saw blade, laser cutting tool, or water cutting tool 336. Each of the individual bottom SiP submodules 301 includes a semiconductor die 104, discrete devices 312, or any other desired combination of electrical components.

Figure 12:
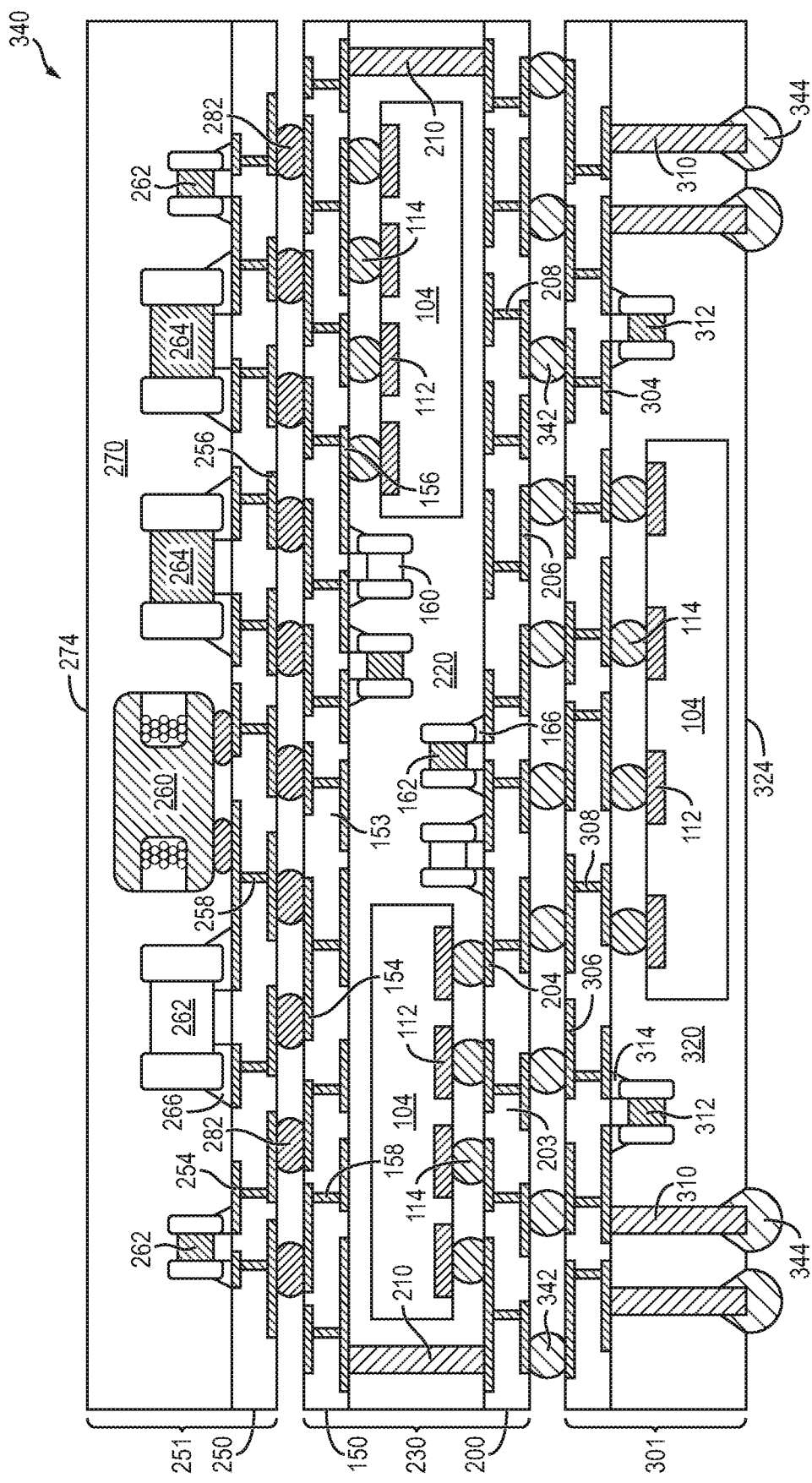
FIG. 12 illustrates a SiP module with the EDS and both the top and bottom SiP submodules.

FIG. 12 illustrates a SiP module 340 with both top SiP submodule 251 and bottom SiP submodule 301 mounted to EDS 230. Top SiP submodule 251 and EDS 230 are combined as discussed above with regard to FIGS. 9 and 10. In one embodiment, bottom SiP panel 330, EDS panel 224, and top SiP panel 280 are all stacked prior to singulation with bumps 282 between the top panel and EDS panel and bumps 342 between the EDS panel and bottom panel. Bumps 282 and 342 are reflowed at the same time to mechanically and electrically connect all three panels prior to singulating any of the three. In other embodiments, EDS panel 224 is flipped before or after top SiP submodules 251 are attached. SiP submodules 301 are mounted onto substrate 200 after singulation of panel 330, or panel 330 can be mounted as a whole.

Bumps 344 are formed on the exposed ends of pillars 310 and extend into grooves 332. Bumps 344 are applied in a similar manner as bumps 114. Bumps 344 are formed on pillars 310 prior to singulation of panel 330 into bottom SiP submodules 301 in some embodiments. Bumps 344 provide a similar function to bumps 284 in FIG. 9. Bumps 344 are used to mount SiP module 340 to a substrate of a larger electronic device, thus incorporating the SiP module functionality into the electronic device.

Figure 13A:
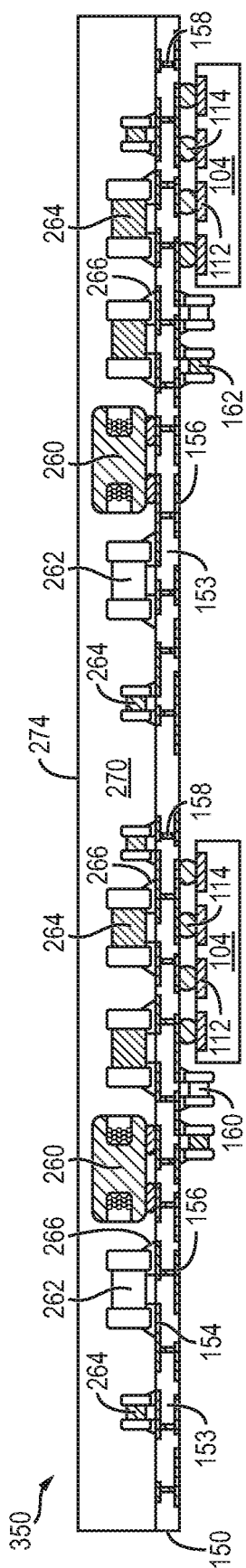
FIGS. 13a-13c illustrate forming the top and bottom SiP submodules directly on the EDS.
Figure 13B:
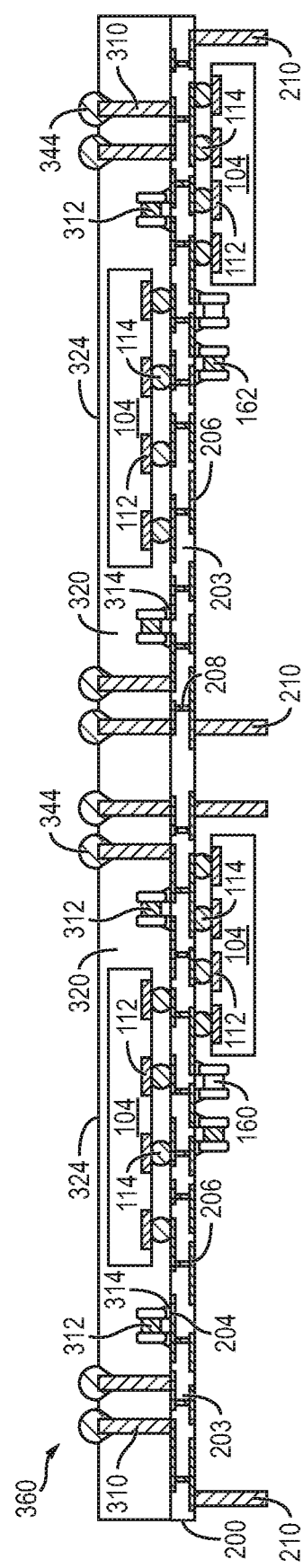
Figure 13C:
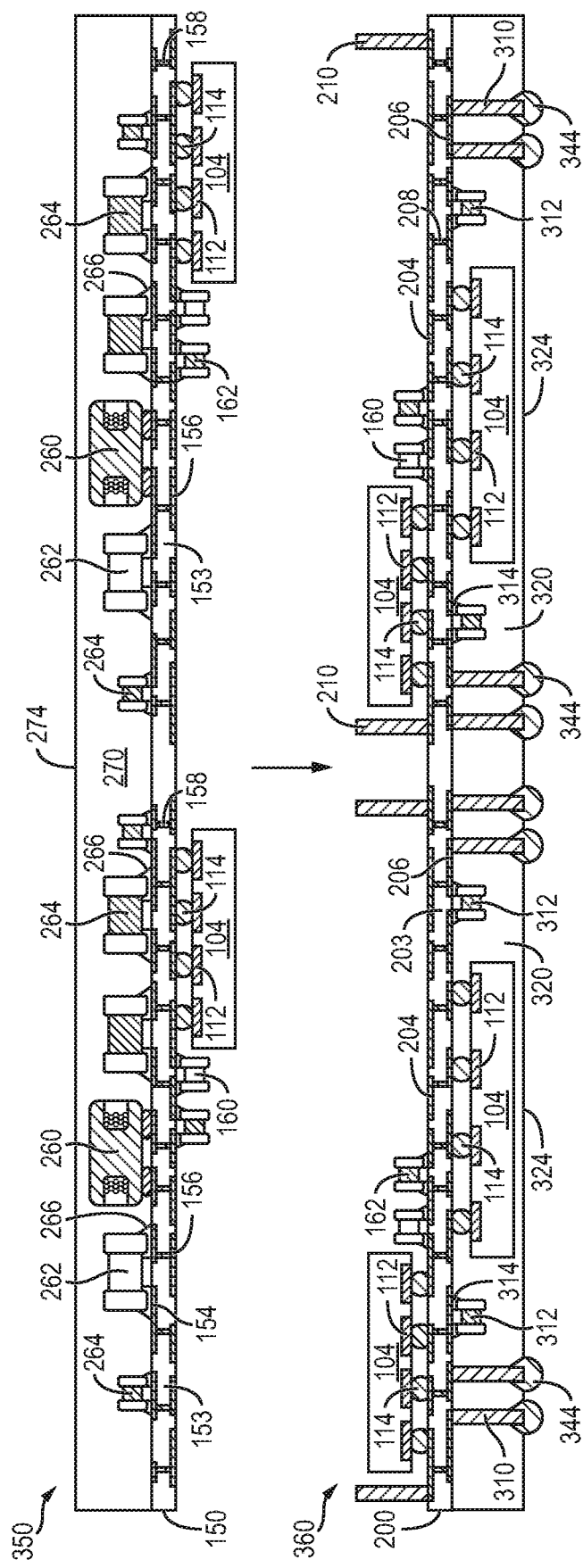

FIGS. 13a-13c illustrate forming a SiP module with top and bottom SiP submodules formed directly on the substrates of an EDS. In FIG. 13a, a top SiP panel 350 is formed based on substrate 150 in FIG. 2b. Discrete devices 260-264 and encapsulant 270 are provided in FIG. 13a as in FIGS. 8a-8d, but are disposed directly onto conductive layer 156 of substrate 150 rather than on a separate substrate 250. In FIG. 13b, a bottom SiP panel 360 is formed based on substrate 200 from FIG. 3b. Conductive pillars 310, semiconductor die 104, discrete devices 312, encapsulant 320, and conductive bumps 344 are provided as in FIGS. 11a-11f, but disposed directly onto conductive layer 206 of substrate 200 rather than onto a separate substrate 300. In FIG. 13c, panels 350 and 360 are mounted together with substrates 150 and 200 connected by conductive pillars 210 as in FIG. 4a.

Figure 14A:
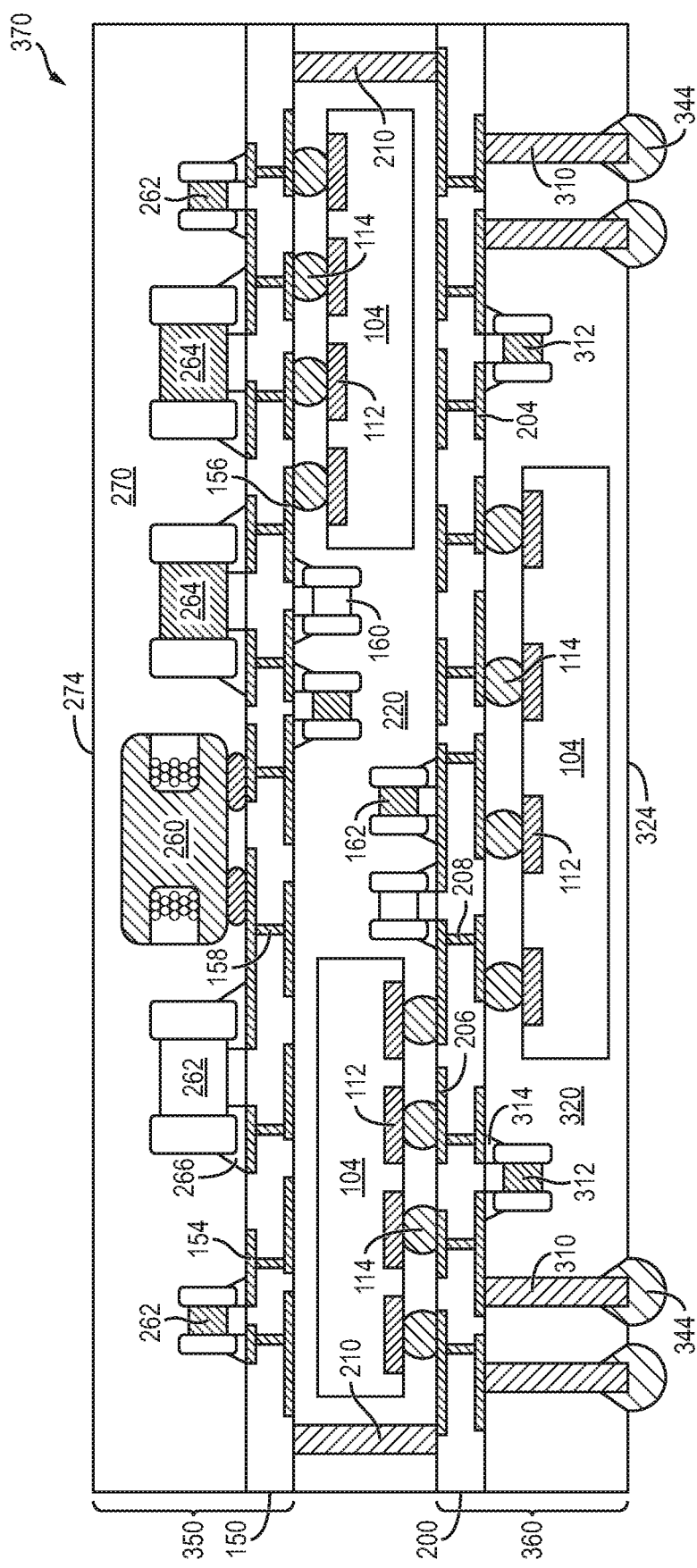
FIGS. 14a-14b illustrate SiP modules including the EDS with the SiP submodules formed directly on the EDS.
Figure 14B:
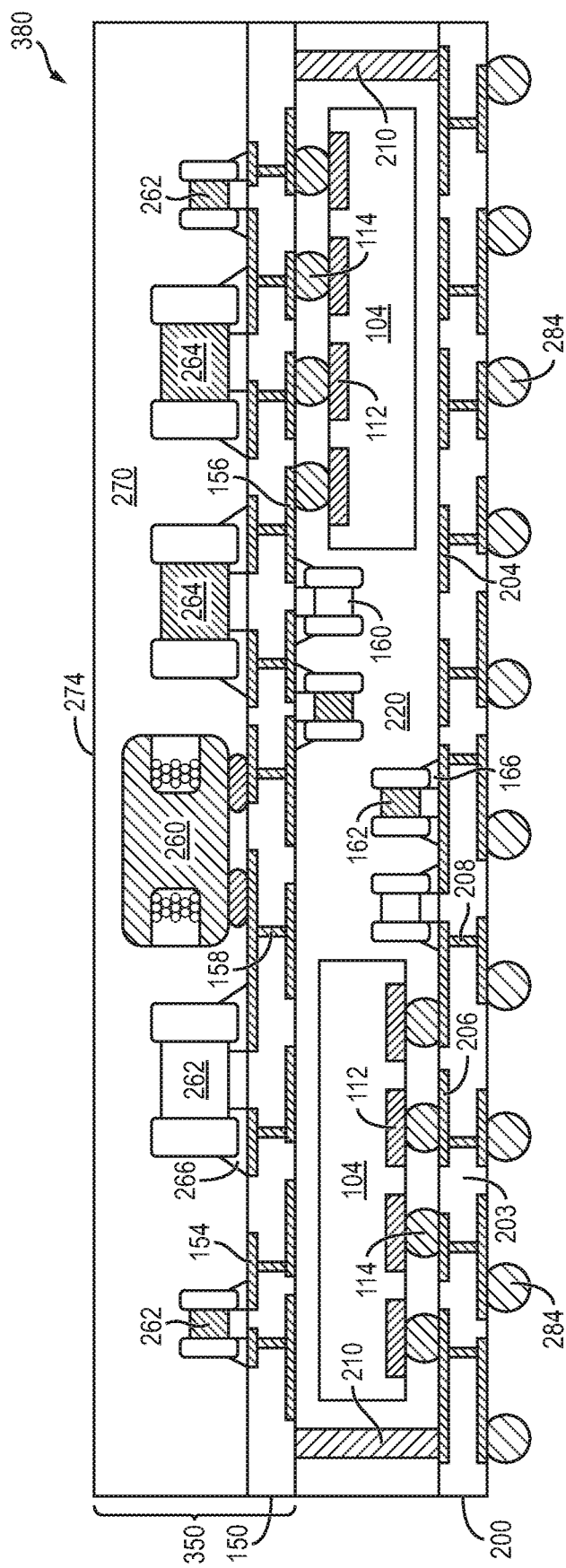

Encapsulant 220 is deposited between substrates 150 and 200, and then panels 350 and 360 are singulated into a plurality of SiP modules 370 as shown in FIG. 14a. SiP module 370 includes any desired combination of semiconductor die and discrete components mounted on the top and bottom surfaces of substrates 150 and 200. All of the components mounted onto substrates 150 and 200 are electrically connected to each other and to bumps 344 through the substrates and conductive pillars 210 and 310 for further system integration. FIG. 14b illustrates an embodiment of SiP module 380 formed from top SiP panel 350 as in FIG. 13a, but with bottom substrate 200 used as in FIG. 3b. Bumps 284 are disposed over conductive layer 206 as in FIG. 9.

Figure 15A:
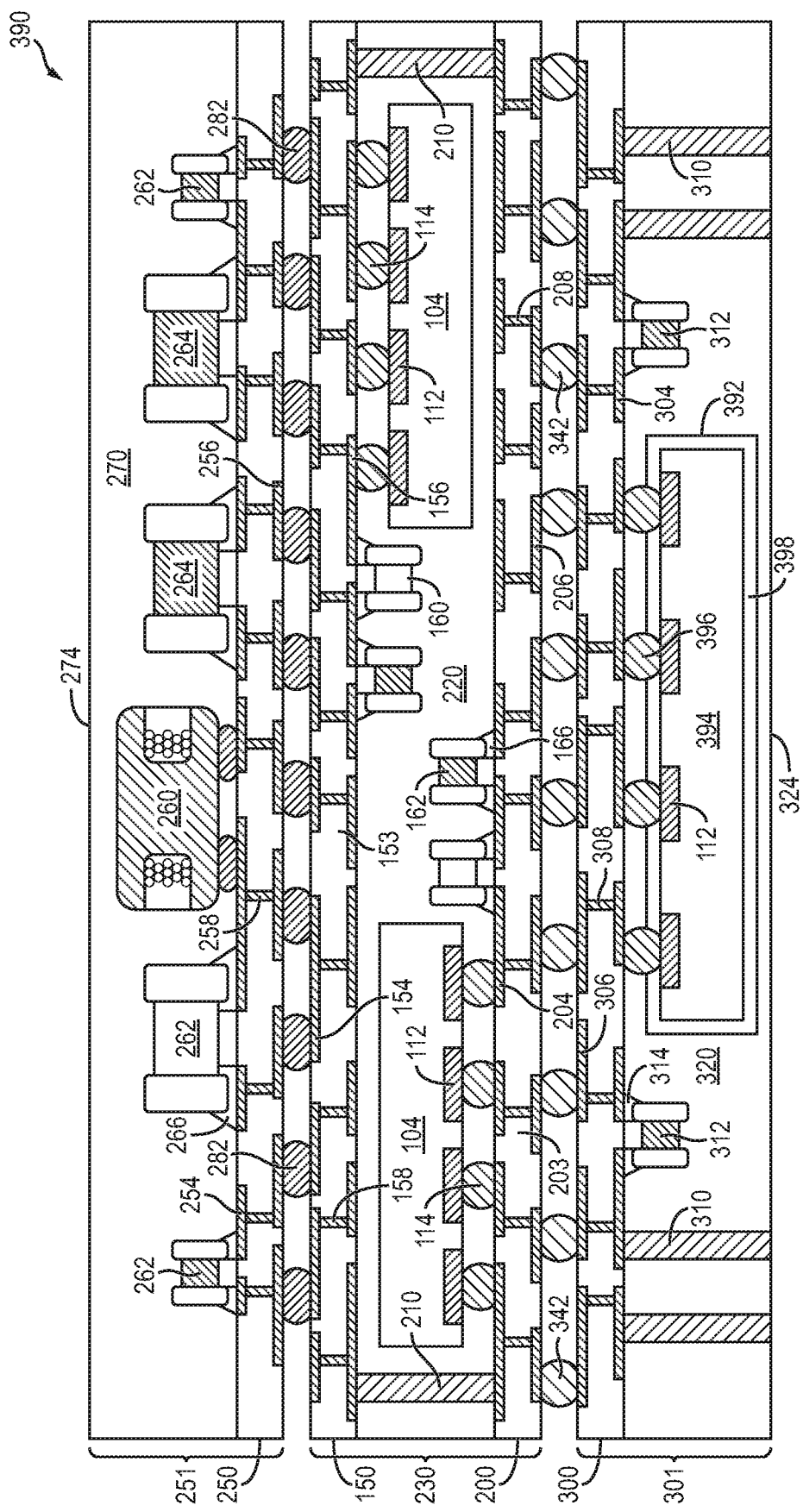
FIGS. 15a-15c illustrate SiP submodules with separately packaged semiconductor components mounted onto the EDS.
Figure 15B:
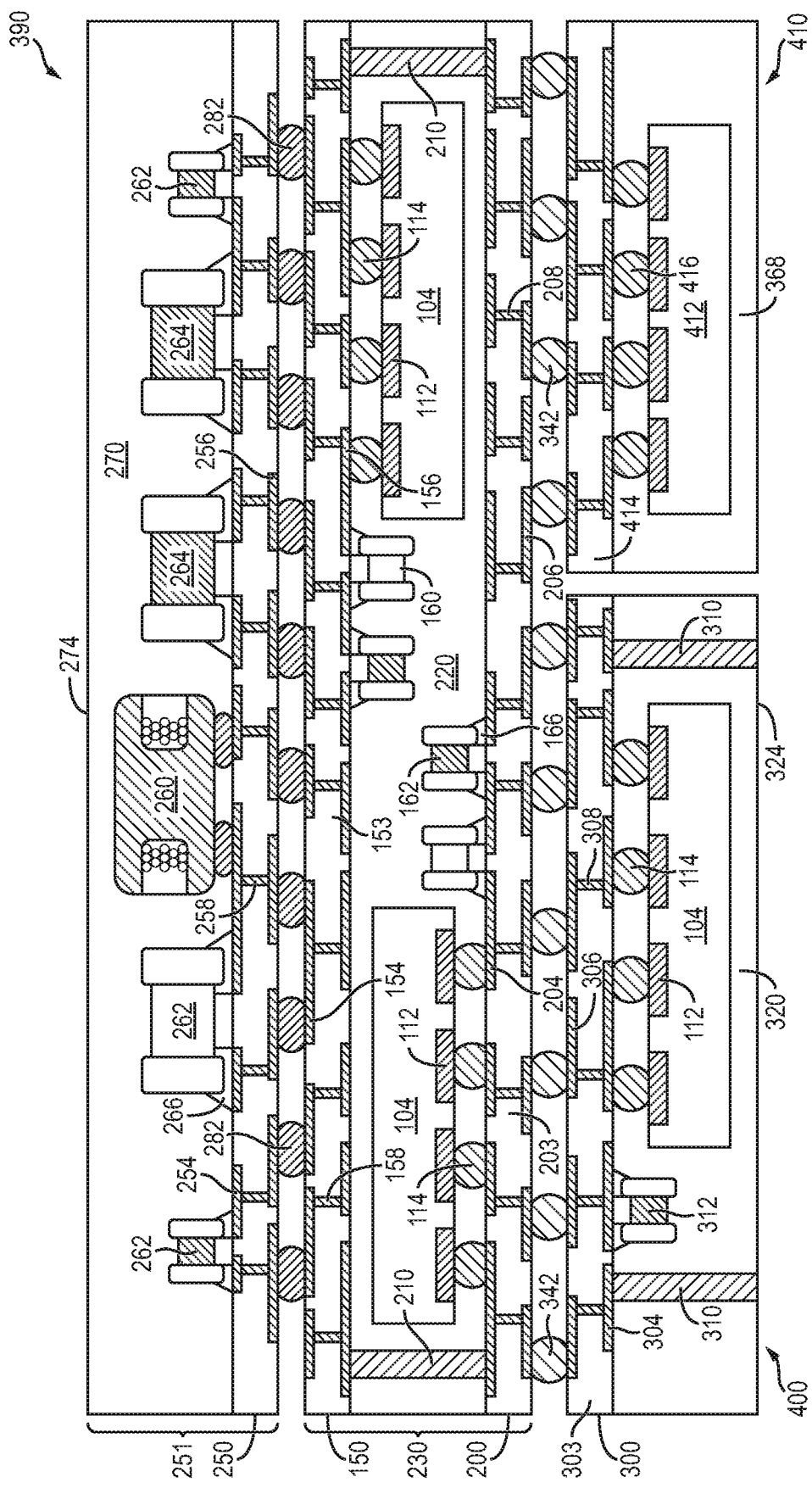
Figure 15C:
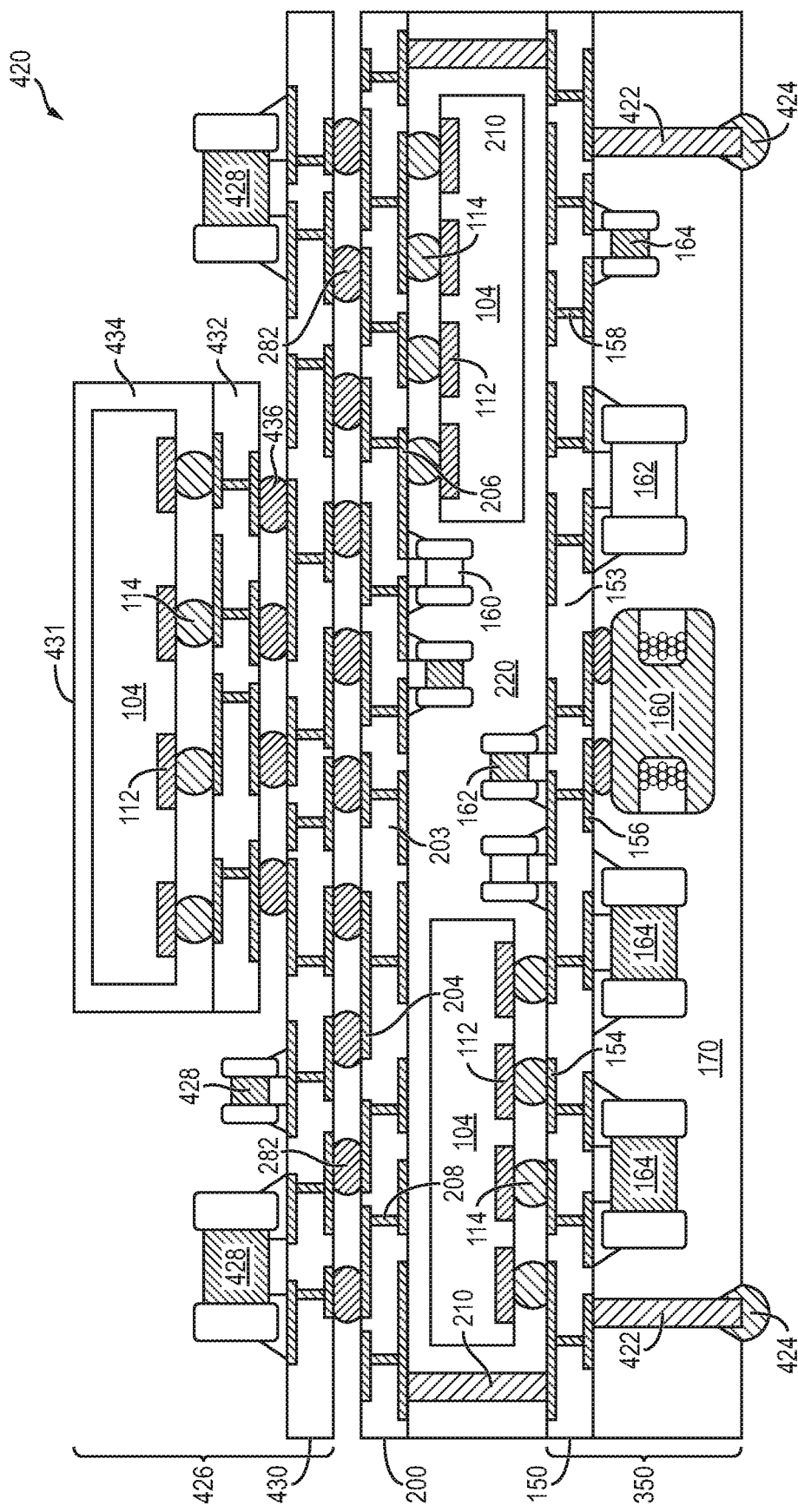

FIGS. 15a-15c illustrate usage of separately packaged semiconductor die to form SiP modules from EDS 230. FIG. 15a shows SiP module 390, which is similar to SiP module 340 but with semiconductor package 392 replacing the bare semiconductor die 104. Semiconductor die 394 is bumped with conductive bumps 396 and encapsulated with encapsulant 398 to form package 392. In other embodiments, other types of semiconductor packages 392 are mounted on substrate 300. Semiconductor packages 392 can include leadframes or substrates for the package. In various embodiments, any of the semiconductor die disclosed herein can be replaced with a packaged die of any package type.

FIG. 15b illustrates two separate bottom SiP submodules 400 and 410 disposed on substrate 200 of EDS 230. Bottom SiP submodule 400 is similar to bottom SiP submodule 301, and includes semiconductor die 104, discrete devices 312, and conductive pillars 310. Bottom SiP submodule 410 is a separately packaged semiconductor die 412. Semiconductor die 412 is disposed on a substrate 414 using conductive bumps 416 and molded within encapsulant 418. Any other type of semiconductor package can be mounted to conductive layer 206 of substrate 200 adjacent to bottom SiP submodule 400 as bottom SiP submodule 410. Bottom SiP submodule 410 can include other types of substrates or leadframes, or can be formed without a substrate as with semiconductor package 392 in FIG. 15a. Bottom SiP submodule 410 can include conductive pillars 310, or other vertical interconnect structures, to allow connection through bottom SiP submodule 410 to an underlying substrate of a larger system as in FIGS. 19a-19b. Bottom SiP submodule 410 can also incorporate discrete devices and any other features of bottom SiP submodules 400 or 301.

In FIG. 15c, SiP module 420 includes panel 350 from FIG. 13a combined with substrate 200 in FIG. 3b. Panel 350 is formed with conductive pillars 422 extending through encapsulant 170 and conductive bumps 424 over the pillars for subsequent system integration. A top SiP submodule 426 includes discrete devices 428 and semiconductor package 431 mounted on substrate 430. Semiconductor package 431 is similar to semiconductor package 410 in FIG. 15b. As illustrated, semiconductor package 431 includes semiconductor die 104 mounted on substrate 432, molded with encapsulant 434, and mounted to substrate 430 with conductive bumps 436. Other semiconductor package types are used in other embodiments. Semiconductor die 104 in FIG. 15c can all be identical, or have varying functions.

FIGS. 16a-16c illustrate forming an EDS with the embedded components being molded prior to integration into the EDS. FIG. 16a illustrates substrate 150 with semiconductor die 104 and discrete devices 160 and 162 mounted onto the substrate. Semiconductor die 104 and discrete devices 160-162 are molded in encapsulant prior to disposal on substrate 150 to form a semiconductor package 440. In one embodiment, semiconductor die 104 and discrete devices 160-162 for a plurality of substrates 150 or 200 are disposed on a carrier adjacent to each other and encapsulated on the carrier to form a panel of packages 440. Conductive bumps 114 and solder 166 are disposed directly on the carrier and are not completely covered by encapsulant. The encapsulated panel of semiconductor packages 440 is singulated into individual packages for use with substrates 150 or 200. Semiconductor packages 440 are disposed on substrate 150 with bumps 114 and solder 166 on conductive layer 154.

A portion of the components disposed on substrate 150 or 200 can be packaged together, while other discrete components or semiconductor die are disposed outside the encapsulant. For purposes of illustration, FIG. 16a illustrates each component on substrate 150 encapsulated in package 440, while FIG. 16b illustrates substrate 200 with semiconductor die 104 within semiconductor package 442 and discrete devices 160-162 outside the package. In one embodiment, the same package configuration is used on both substrate 150 and substrate 200. In other embodiments, any combination of semiconductor die, semiconductor packages, and other components can be surface mounted onto substrates 150 and 200. The semiconductor packages used on substrates 150 and 200 include any type of semiconductor package, and include substrates or leadframes within the packages in some embodiments.

In FIG. 16c, substrates 150 and 200 are stacked face-to-face and encapsulated as in FIGS. 4a-4b to form EDS 446. EDS 446 can be singulated as in FIG. 4c, or left as a larger panel until additional SiP module components are added.

Figure 17A:
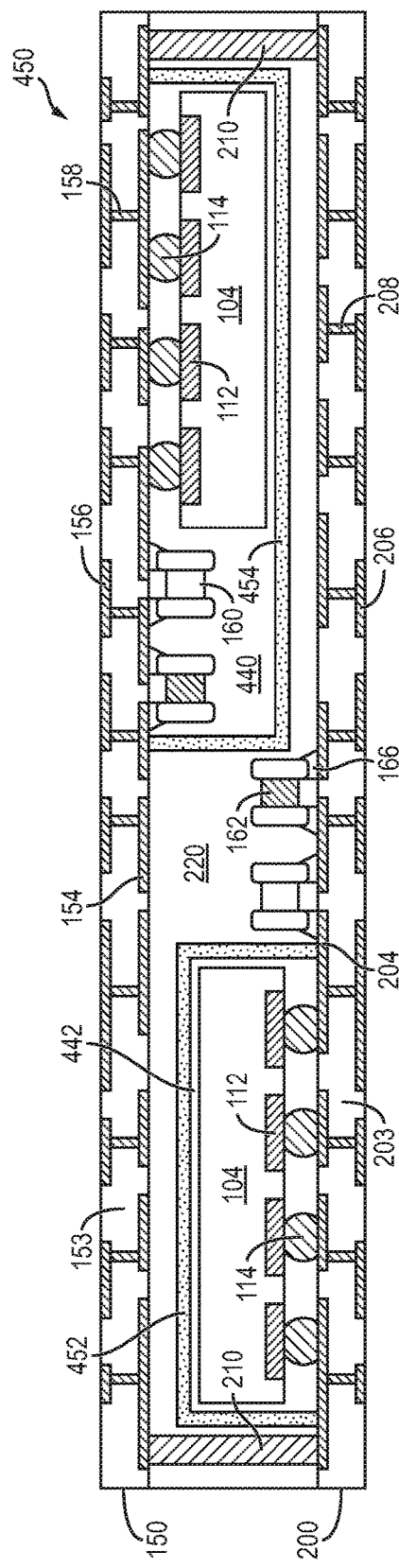
FIGS. 17a-17c illustrate electromagnetic interference (EMI) shielding options for the EDS with separately packaged semiconductor components.
Figure 17B:
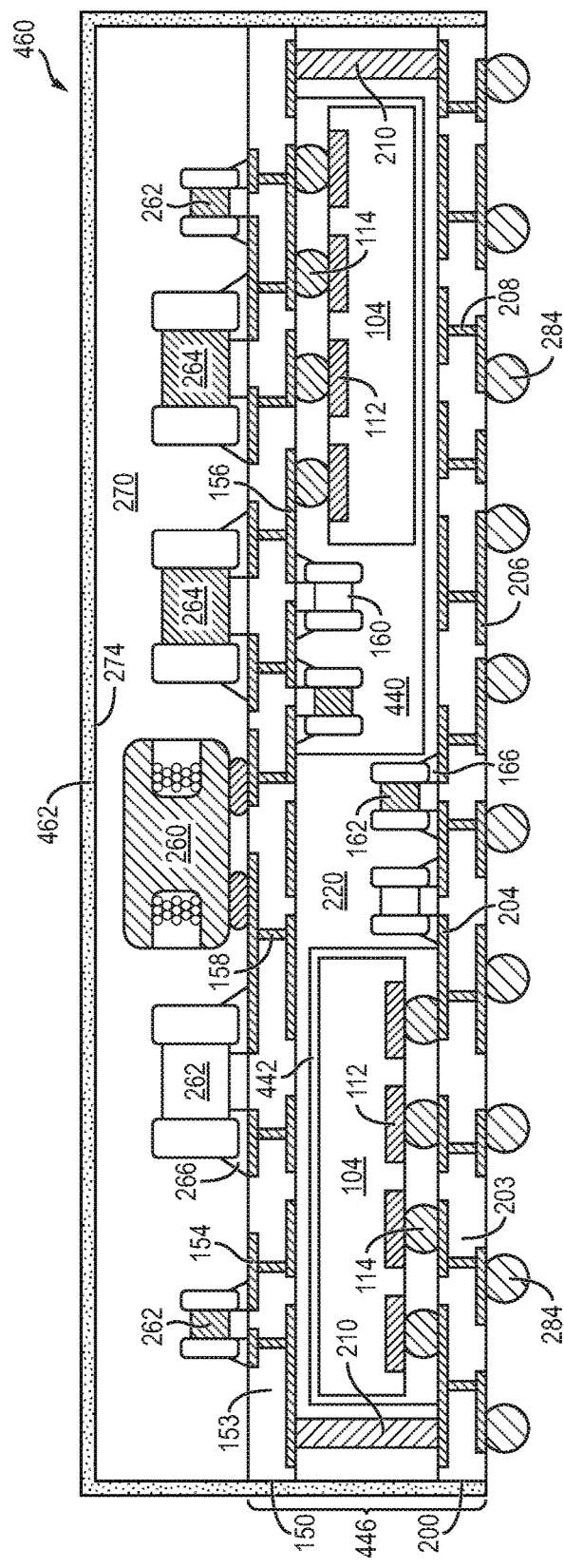
Figure 17C:
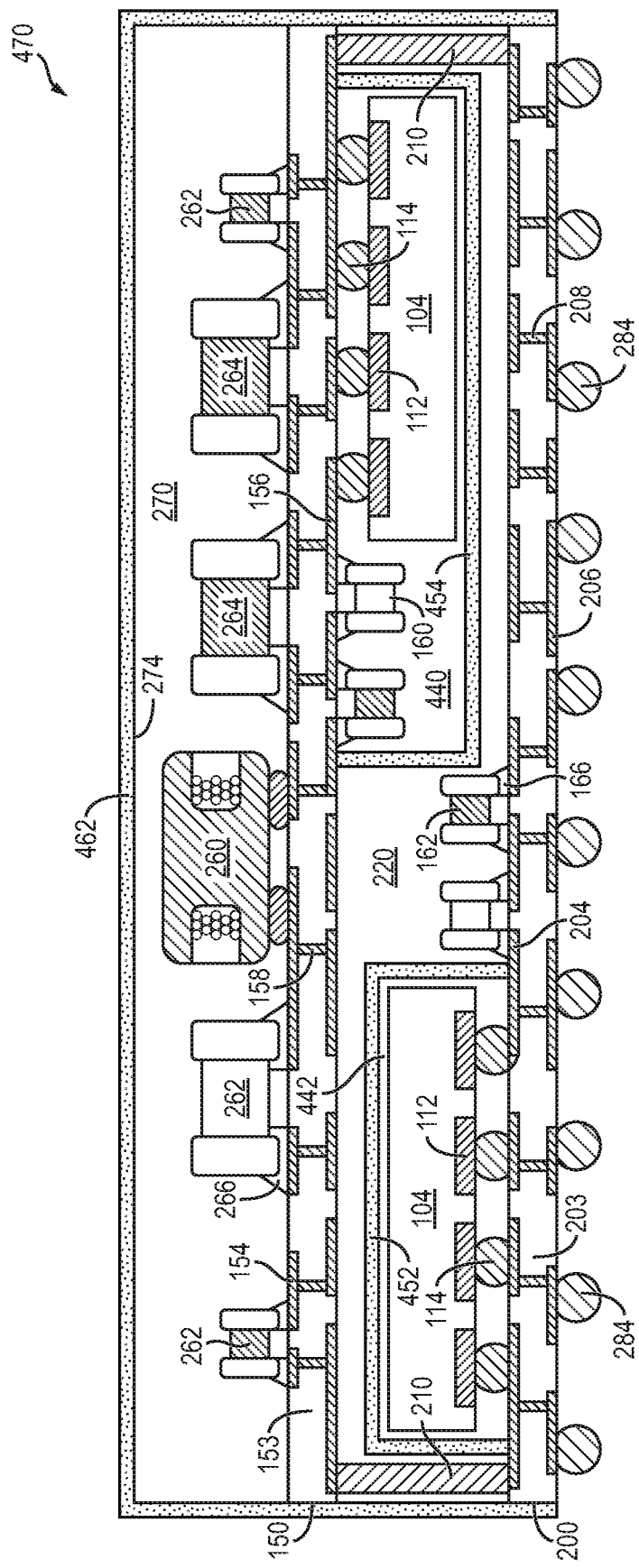

FIGS. 17a-17c illustrate options for electromagnetic interference (EMI) shielding of SiP modules with semiconductor packages between substrates 150 and 200. FIG. 17a illustrates EDS 450 with semiconductor packages 440 and 442. Semiconductor package 442 includes shielding layer 452 formed over the package. Semiconductor package 440 includes shielding layer 454 formed over the package. Shielding layers 452 and 454 are applied during manufacturing of packages 442 and 440 in one embodiment. The panel of encapsulated components is singulated through the encapsulant but left on a carrier. Singulation removes the encapsulant material between each of the adjacent packages. Conductive material is plated over the top of the packages and into the space between packages created by singulation. Plating is performed by CVD, PVD, electroless plating, or other suitable metal deposition process. Shielding layers 452 and 454 include one or more layers of Al, Cu, Sn, Ni, Au, Ag, or other suitable electrically conductive material. The devices are singulated through their shielding layers to finally separate each of the devices prior to mounting on substrates 150 and 200. In other embodiments, packages 440 and 442 are plated with shielding layers 452 and 454 after mounting onto substrates 150 and 200 by using a masking layer over other areas of the substrates.

Shielding layers 452 and 454 cover top and side surfaces of packages 442 and 440, respectively. In some embodiments, shielding layers 452 and 454 are electrically connected to conductive layers of the substrates to provide electrical grounding. Shielding layers 452 and 454 can be applied over any suitable type of semiconductor package used with substrates 150 and 200. Shielding layers 452 and 454 are formed using any suitable process for forming a shielding layer over a semiconductor package. Shielding layers 452 and 454 reduce the amount of the electromagnetic radiation hitting packages 442 and 440 that reaches semiconductor die 104 and other components within the packages. EDS 450 can form the basis for any of the SiP modules disclosed herein.

FIG. 17b illustrates SiP module 460 manufactured based on EDS 446. Discrete devices 260-264 are mounted onto substrate 250 and molded with encapsulant 270. Shielding layer 462 is formed over the entire SiP module 460 after discrete devices 260-264 and encapsulant 270 are added. In one embodiment, a plurality of SiP modules 460 are formed as a panel and singulated on a carrier. Shielding layer 462 is deposited over the panel after singulation while the units remain on the carrier. Shielding layer 462 is substantially similar to shielding layers 452 and 454, but formed at the SiP module level rather than at the semiconductor package level.

FIG. 17c illustrates SiP module 470 formed with both shielding layers 452 and 454 from FIG. 17a and shielding layer 462 from FIG. 17b.

Figure 18A:
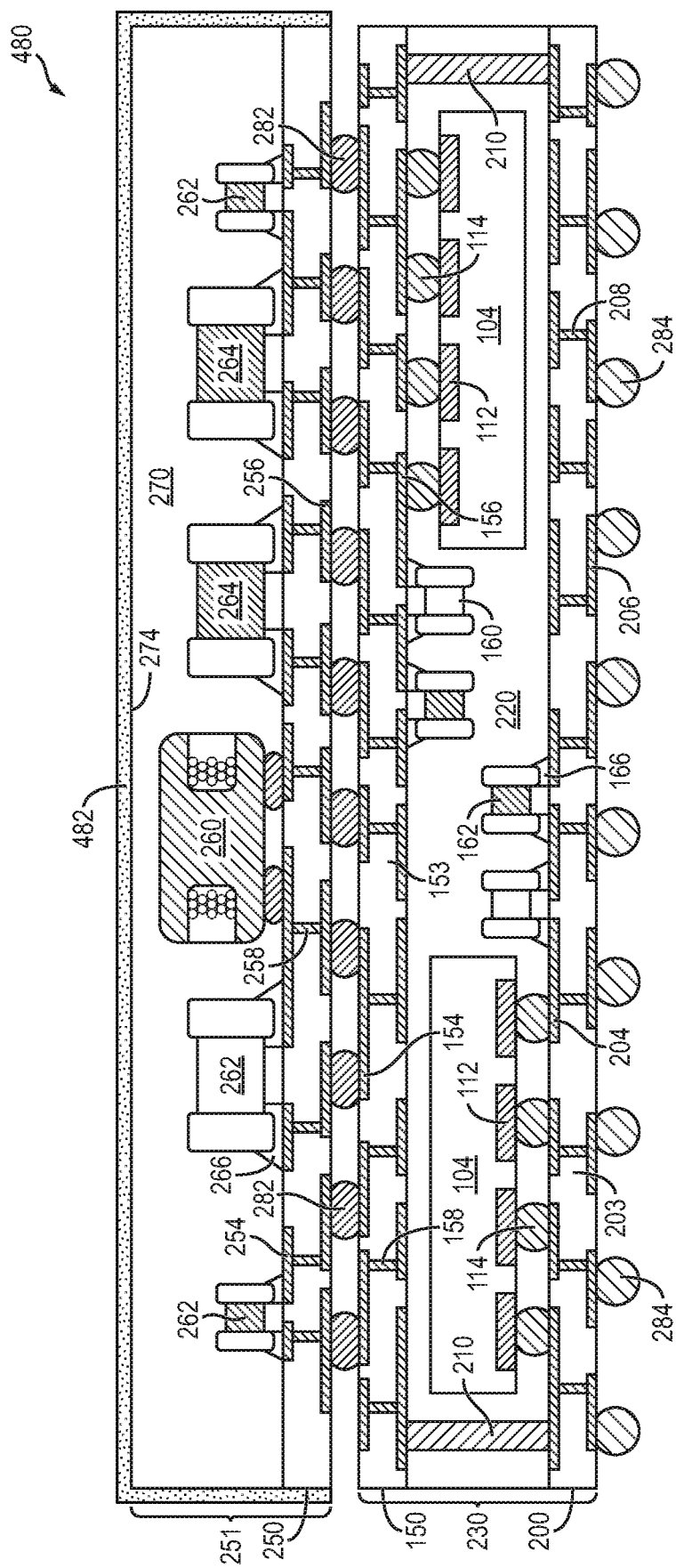
FIGS. 18a-18d illustrate additional EMI shielding options for SiP modules made with the EDS.

FIGS. 18a-18d illustrate additional EMI shielding options for SiP modules with EDS substrates. FIG. 18a illustrates SiP module 480 with a shielding layer 482 formed over top SiP submodule 251. Top SiP submodule 251 is formed as in FIG. 8a-8d, and shielding layer 482 is formed over the panel of units after singulation. In some embodiments, conductive layer 254 or conductive layer 256 extend laterally to the edge of substrate 250 to contact shielding layer 482 and provide a ground connection.

Figure 18B:
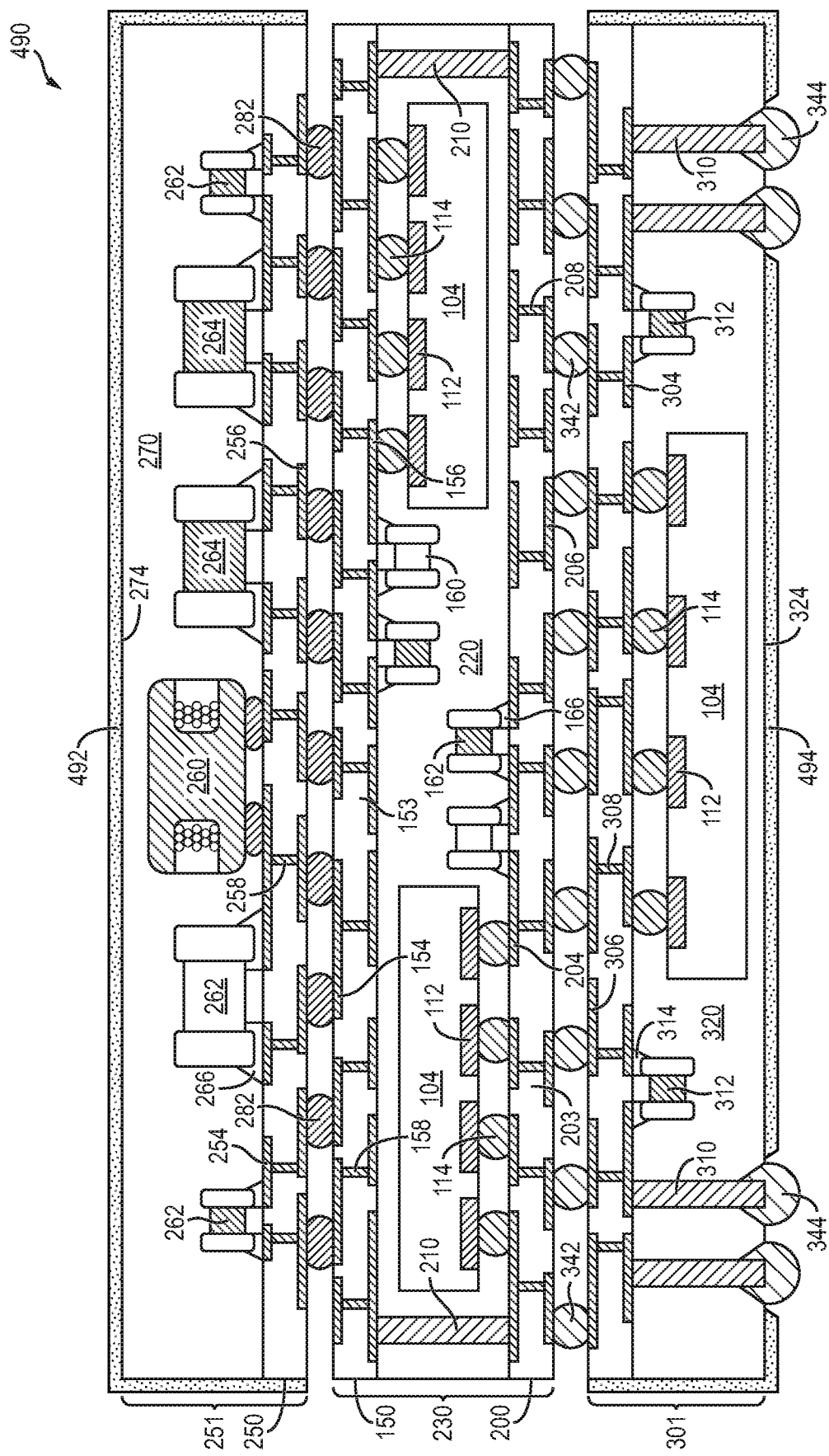

FIG. 18b shows SiP module 490 that adds lower SiP submodule 301 as in FIG. 12, with shielding layer 494 formed over the lower SiP submodule. Bottom SiP submodule 301 is formed as shown in FIGS. 11a-11f. After singulation in FIG. 11f, but before removing the units from a carrier that the singulation occurred on, the panel is plated with shielding layer 494. Openings are etched through shielding layer 494 to expose conductive pillars 310 for further system integration. In some embodiments, grooves 332 are formed around pillars 310 after shielding layer 494 is formed.

Figure 18C:
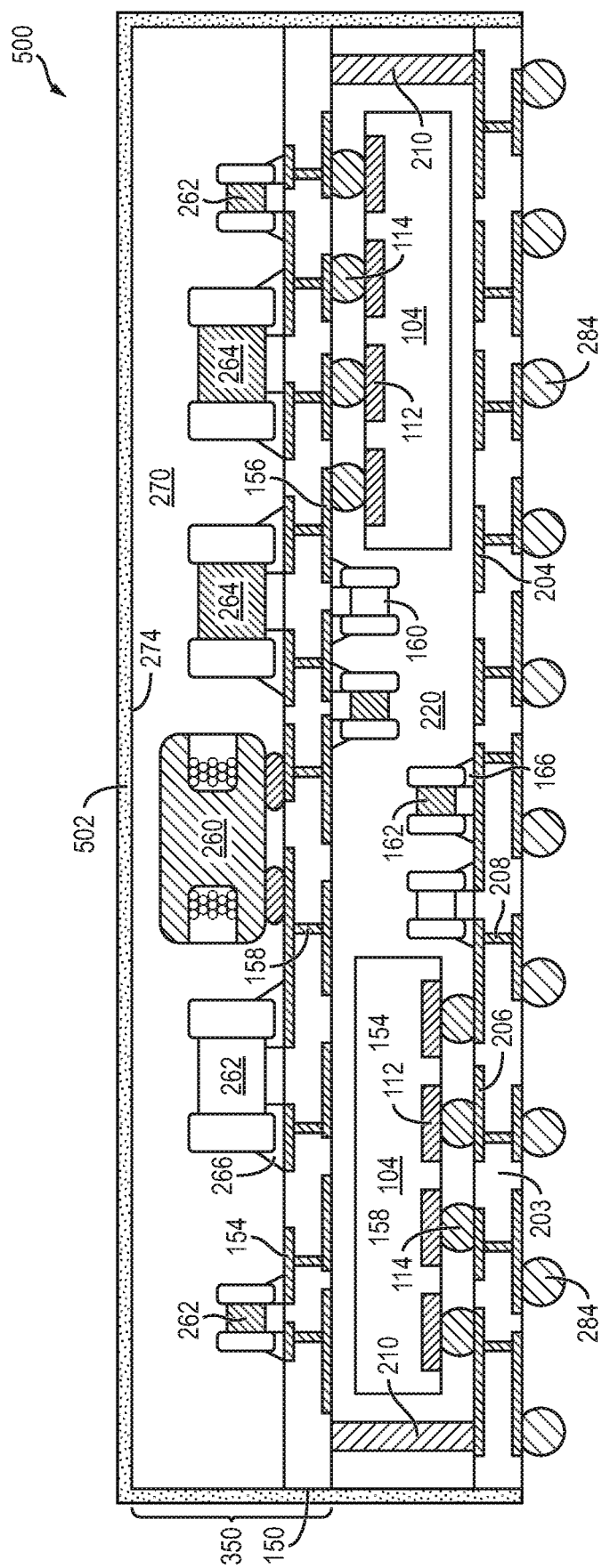
Figure 18D:
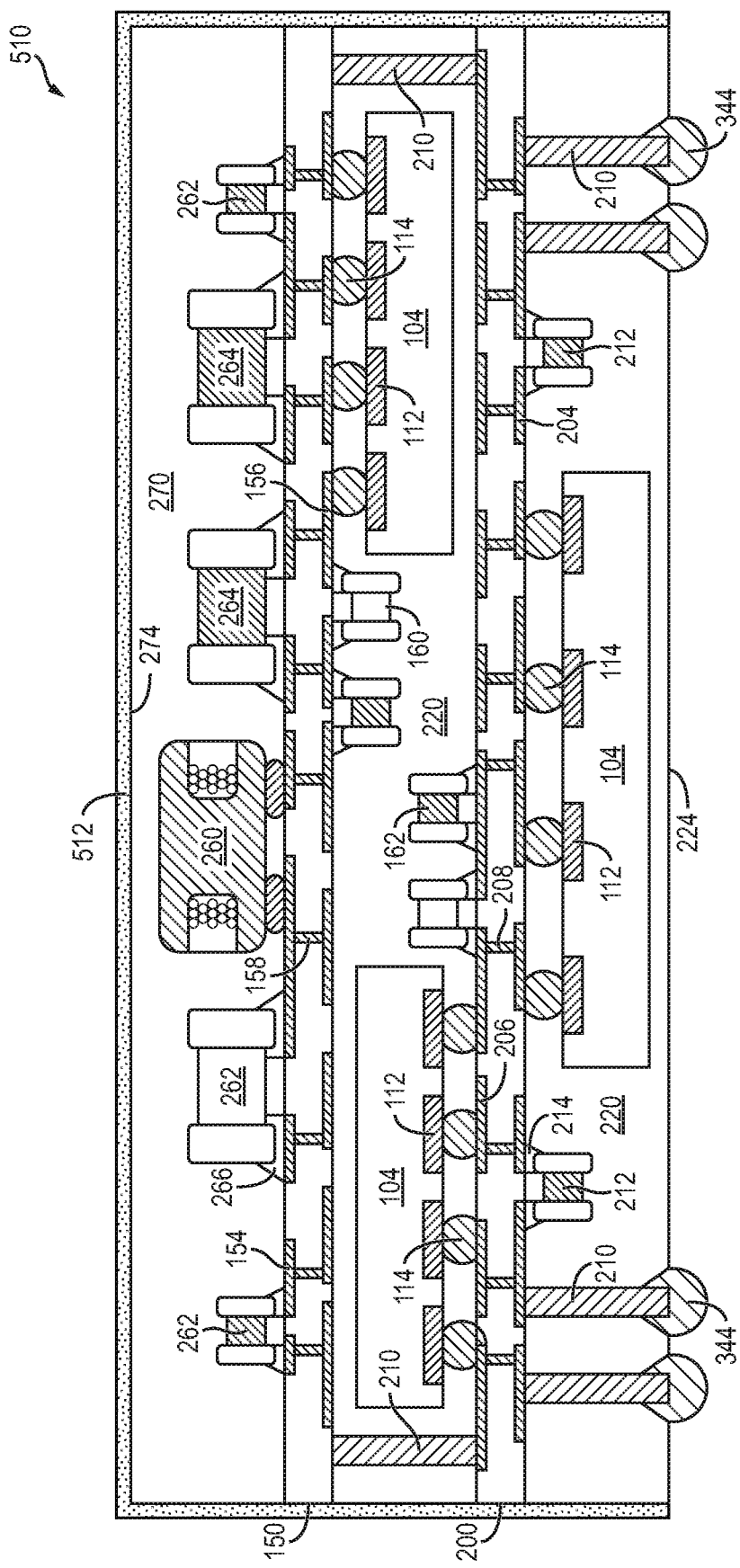

FIG. 18c illustrates a SiP module 500 formed by adding shielding layer 502 to SiP module 380 in FIG. 14b. FIG. 18d illustrates a SiP module 510 formed by adding shielding layer 512 to SiP module 370 in FIG. 14a. Shielding layers 502 and 512 are formed in a similar manner to shielding layers 452, 454, and 462 above.

FIGS. 19a-19b illustrate incorporating the above described SiP modules and EDS substrates into an electronic device. FIG. 19a illustrates a partial cross-section of SiP module 380 from FIG. 14b mounted onto a PCB or other substrate 520 as part of an electronic device. Bumps 284 are reflowed onto conductive layer 522 to physically attach and electrically connect SiP module 380 to PCB 520. Any of the above described SiP modules, or EDS substrates alone, can similarly be mounted onto PCB 520. In other embodiments, thermocompression or other suitable attachment and connection methods are used. In some embodiments, an adhesive or underfill layer is used between SiP module 380 and PCB 520.

Semiconductor die 104 are electrically coupled to conductive layer 522 through bumps 114, substrates 200 and 150, conductive pillars 210, and conductive bumps 284. Discrete devices 260-264 are coupled to conductive layer 522 and semiconductor die 104 through substrate 150, conductive pillars 210, substrate 200, and conductive bumps 284.

FIG. 19b illustrates electronic device 524 including PCB 520 with a plurality of semiconductor packages mounted on a surface of the PCB, including SiP module 380. Electronic device 524 can have one type of semiconductor package, or multiple types of semiconductor packages, depending on the application.

Electronic device 524 can be a stand-alone system that uses the semiconductor packages to perform one or more electrical functions. Alternatively, electronic device 524 can be a subcomponent of a larger system. For example, electronic device 524 can be part of a tablet, cellular phone, digital camera, communication system, or other electronic device. Electronic device 524 can also be a graphics card, network interface card, or other signal processing card that is inserted into a computer. The semiconductor packages can include microprocessors, memories, ASICs, logic circuits, analog circuits, RF circuits, discrete active or passive devices, or other semiconductor die or electrical components.

In FIG. 19b, PCB 520 provides a general substrate for structural support and electrical interconnection of the semiconductor packages mounted on the PCB. In some embodiments, PCB 520 is manufactured as an EDS in accordance with the above description, and includes active and passive components embedded within the PCB. Conductive signal traces 522 are formed over a surface or within layers of PCB 520 using evaporation, electrolytic plating, electroless plating, screen printing, or other suitable metal deposition process. Signal traces 522 provide for electrical communication between each of the semiconductor packages, mounted components, and other external systems or components. Traces 522 also provide power and ground connections to each of the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 526 and flipchip 528, are shown on PCB 520. Additionally, several types of second level packaging, including ball grid array (BGA) 530, bump chip carrier (BCC) 532, land grid array (LGA) 536, multi-chip module (MCM) 538, quad flat non-leaded package (QFN) 540, embedded wafer level ball grid array (eWLB) 544, and wafer level chip scale package (WLCSP) 546 are shown mounted on PCB 520 along with SiP module 380. In one embodiment, eWLB 544 is a fan-out wafer level package (Fo-WLP) and WLCSP 546 is a fan-in wafer level package (Fi-WLP).

Depending upon the system requirements, any combination of semiconductor packages, configured with any combination of first and second level packaging styles, as well as other electronic components, can be connected to PCB 520. In some embodiments, electronic device 524 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a first substrate including a first semiconductor component disposed on a first surface of the first substrate;
a second substrate disposed over the first substrate and including a second semiconductor component disposed on a first surface of the second substrate, wherein the first semiconductor component and second semiconductor component are disposed between the first substrate and second substrate, and wherein an area of the first surface of the first substrate over the second semiconductor component is devoid of semiconductor components mounted on the first substrate and an area of the first surface of the second substrate over the first semiconductor component is devoid of semiconductor components mounted on the second substrate;
a first vertical interconnect structure extending from the first substrate to the second substrate;
a first encapsulant deposited between the first substrate and second substrate;
a second encapsulant deposited over the first substrate opposite the first encapsulant; and
a second vertical interconnect structure extending through the second encapsulant.

2. The semiconductor device of claim 1, further including a shielding layer formed over the SiP submodule.

3. The semiconductor device of claim 1, wherein the first semiconductor component or second semiconductor component is a semiconductor package.

4. The semiconductor device of claim 1, further including a third substrate disposed over the first substrate, wherein the third encapsulant is deposited over the third substrate.

5. The semiconductor device of claim 4, further including a solder bump disposed between the first substrate and third substrate.

6. The semiconductor device of claim 1, further including a solder bump disposed on the second vertical interconnect structure outside the encapsulant.

7. A semiconductor device, comprising:
a first substrate including a first semiconductor die on the first substrate;
a first encapsulant deposited over the first semiconductor die and contacting the first substrate;
a second substrate including a second semiconductor die and a vertical interconnect structure disposed on the second substrate, wherein the first substrate is disposed over the second substrate with the first semiconductor die outside a footprint of the second semiconductor die and the vertical interconnect structure connected from the first substrate to the second substrate;
a second encapsulant deposited over the second semiconductor die and contacting the second substrate; and
a third encapsulant deposited between the first substrate and second substrate, wherein the third encapsulant contacts the first encapsulant and second encapsulant.

8. The semiconductor device of claim 7, further including a semiconductor component disposed over the first substrate opposite the first semiconductor die.

9. The semiconductor device of claim 8, further including:
a third substrate disposed over the first substrate with the semiconductor component disposed on the third substrate; and
a fourth encapsulant deposited over the third substrate and semiconductor component.

10. The semiconductor device of claim 9, further including a shielding layer formed over the fourth encapsulant, wherein the shielding layer contacts the first substrate and second substrate.

11. The semiconductor device of claim 8, wherein the semiconductor component includes a semiconductor package.

12. The semiconductor device of claim 7, further including a SiP submodule disposed over the first substrate.

13. The semiconductor device of claim 12, further including a shielding layer formed over the SiP submodule.

14. A semiconductor device, comprising:
a first substrate with a first semiconductor component mounted to the first substrate;
a second substrate disposed over the first substrate with a second semiconductor component mounted to the second substrate, wherein the second semiconductor component is within a height of the first semiconductor component; and a first encapsulant deposited between the first substrate and second substrate over the first semiconductor component and second semiconductor component;

a second encapsulant deposited over the first substrate opposite the first encapsulant;

a vertical interconnect structure extending through the second encapsulant; and a groove formed in the second encapsulant around the vertical interconnect structure.

15. The semiconductor device of claim 14, further including a second vertical interconnect structure disposed between the first substrate and second substrate.

16. The semiconductor device of claim 14, further including a third semiconductor component disposed over the first substrate in the second encapsulant.

17. The semiconductor device of claim 14, further including a SiP submodule disposed over the first substrate opposite the first semiconductor component, wherein the second encapsulant is part of the SiP submodule.

18. The semiconductor device of claim 14, further including a solder bump disposed in the groove.

19. The semiconductor device of claim 14, wherein the first semiconductor component includes a shielding layer.

20. A semiconductor device, comprising:
a first substrate;
a second substrate;
a first semiconductor component disposed between the first substrate and second substrate;
a first encapsulant deposited between the first substrate and second substrate; and
a second encapsulant deposited over the first substrate with the first substrate disposed between the first encapsulant and second encapsulant.

21. The semiconductor device of claim 20, further including a vertical interconnect structure disposed between the first substrate and second substrate.

22. The semiconductor device of claim 20, further including a second semiconductor component disposed over the first substrate in the second encapsulant.

23. The semiconductor device of claim 20, further including a SiP submodule disposed over the second substrate opposite the first semiconductor component.

24. The semiconductor device of claim 20, further including a vertical interconnect structure extending through the second encapsulant.

25. The semiconductor device of claim 20, wherein the first semiconductor component includes a shielding layer.

* * * * *